(12) United States Patent
Takata et al.

(10) Patent No.: US 7,040,737 B2
(45) Date of Patent: May 9, 2006

(54) INK JET RECORDING DEVICE

(75) Inventors: Masayuki Takata, Nagoya (JP);
Yoichiro Shimizu, Toukai (JP);
Hirotake Nakamura, Nagoya (JP)

(73) Assignee: Brother Kogyo Kabushiki Kaisha,
Nagoya (JP)

( * ) Notice: Subject to any disclaimer, the term of this patent is extended or adjusted under 35 U.S.C. 154(b) by 104 days.

(21) Appl. No.: 10/327,076

(22) Filed: Dec. 24, 2002

(65) Prior Publication Data

US 2003/0160841 A1    Aug. 28, 2003

Related U.S. Application Data

(63) Continuation of application No. 09/899,287, filed on Jul. 6, 2001, now abandoned, and a continuation-in-part of application No. 09/049,046, filed on Mar. 27, 1998, now Pat. No. 6,270,205.

(30) Foreign Application Priority Data

| Mar. 28, 1997 | (JP) | ................................... 9-077257 |
| Mar. 31, 1997 | (JP) | ................................... 9-079601 |
| Mar. 31, 1997 | (JP) | ................................... 9-079602 |
| Jul. 7, 2000 | (JP) | ............................ 2000-207456 |
| Jul. 7, 2000 | (JP) | ............................ 2000-207570 |
| Jul. 7, 2000 | (JP) | ............................ 2000-207571 |
| Jul. 7, 2000 | (JP) | ............................ 2000-207572 |
| Jul. 7, 2000 | (JP) | ............................ 2000-207573 |
| Aug. 11, 2000 | (JP) | ............................ 2000-244264 |
| Aug. 11, 2000 | (JP) | ............................ 2000-244390 |
| Aug. 30, 2000 | (JP) | ............................ 2000-261140 |
| Aug. 30, 2000 | (JP) | ............................ 2000-261157 |

(51) Int. Cl.
*B41J 2/14* (2006.01)
*B41J 2/015* (2006.01)

(52) U.S. Cl. .......................................... 347/50; 347/20
(58) Field of Classification Search .................. 347/20, 347/40, 54, 68, 85–87, 93, 50
See application file for complete search history.

(56) References Cited

U.S. PATENT DOCUMENTS

| 4,680,595 | A | * | 7/1987 | Cruz-Uribe et al. ........... 347/40 |
| 4,929,969 | A | * | 5/1990 | Morris ......................... 347/87 |
| 5,481,289 | A | * | 1/1996 | Arashima et al. .............. 347/93 |
| 5,748,214 | A |   | 5/1998 | Usui et al. |
| 5,774,145 | A |   | 6/1998 | Morita et al. |
| 5,793,396 | A | * | 8/1998 | Sasaki .......................... 347/86 |

(Continued)

FOREIGN PATENT DOCUMENTS

JP        A-63-72314        4/1988

(Continued)

*Primary Examiner*—Stephen Meier
*Assistant Examiner*—An H. Do
(74) *Attorney, Agent, or Firm*—Oliff & Berridge, PLC

(57) ABSTRACT

A color ink jet printer 21 includes a carriage 26 and a head unit 25 supported to the carriage 26. The head unit 25 includes an ink jet head 24 and a base plate 46. The ink jet head 24 includes an actuator having channel members 72 and a center plate 73 interposed between the channel members 72, and the ink jet head 24 also includes manifolds 71. The center plate 73 has a height greater than that of the channel members 72 so as to protrude upward from the channel members 72. Thus protruding portion is directly attached to the base plate 46. Accordingly, the actuator 70 is reliably supported by the base plate 46, thereby preventing positional deviation of nozzles 75 formed to the actuator 70.

42 Claims, 26 Drawing Sheets

U.S. PATENT DOCUMENTS

| | | |
|---|---|---|
| 5,835,110 A | 11/1998 | Sasaki |
| 5,851,075 A | 12/1998 | Imai |
| 6,206,507 B1 | 3/2001 | Hino |
| 6,247,782 B1 * | 6/2001 | Takata .......................... 347/30 |
| 6,270,205 B1 | 8/2001 | Takata |
| 6,296,341 B1 * | 10/2001 | Sugahara .................... 347/19 |
| 6,312,087 B1 * | 11/2001 | Imai et al. ..................... 347/23 |
| 6,318,835 B1 * | 11/2001 | Nakahara .................... 347/30 |
| 6,332,672 B1 * | 12/2001 | Yazaki et al. ................. 347/70 |
| 6,634,742 B1 | 10/2003 | Owaki et al. |
| 6,742,883 B1 | 6/2004 | Takata |

FOREIGN PATENT DOCUMENTS

| | | | |
|---|---|---|---|
| JP | A-4-14454 | 1/1992 |
| JP | A-5-24190 | 2/1993 |
| JP | A-5-50610 | 3/1993 |
| JP | A-5-169654 | 7/1993 |
| JP | A-6-255101 | 9/1994 |
| JP | A-6-312513 | 11/1994 |
| JP | A-7-117232 | 5/1995 |
| JP | A-8-72259 | 3/1996 |
| JP | A-8-174820 | 7/1996 |
| JP | A-8-295033 | 11/1996 |
| JP | A-9-66604 | 3/1997 |
| JP | A-9-131879 | 5/1997 |
| JP | 10-264376 | 10/1998 |
| JP | 10-272769 | 10/1998 |
| JP | 10-272770 | 10/1998 |
| JP | A-10-272784 | 10/1998 |
| JP | A-10-296990 | 11/1998 |
| JP | A-11-286111 | 10/1999 |
| JP | A-2000-177144 | 6/2000 |
| JP | A-2002-178541 | 6/2002 |

* cited by examiner

RELATED ART

FIG. 7
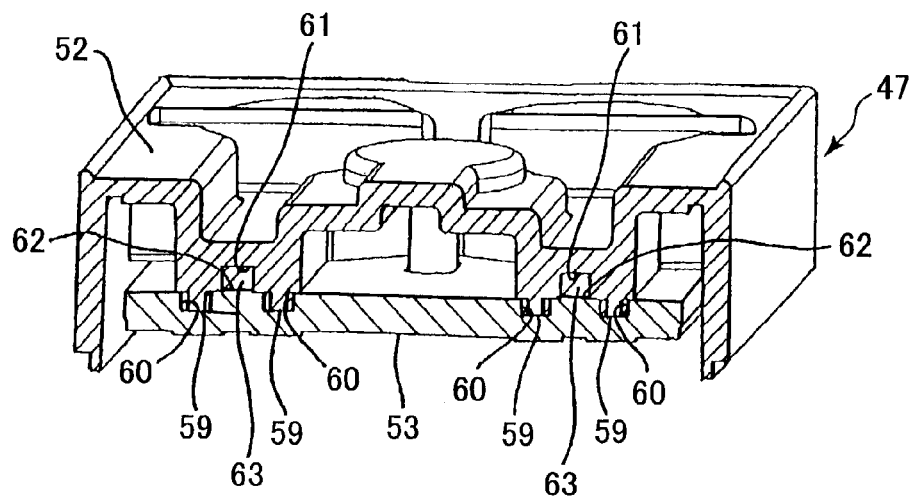
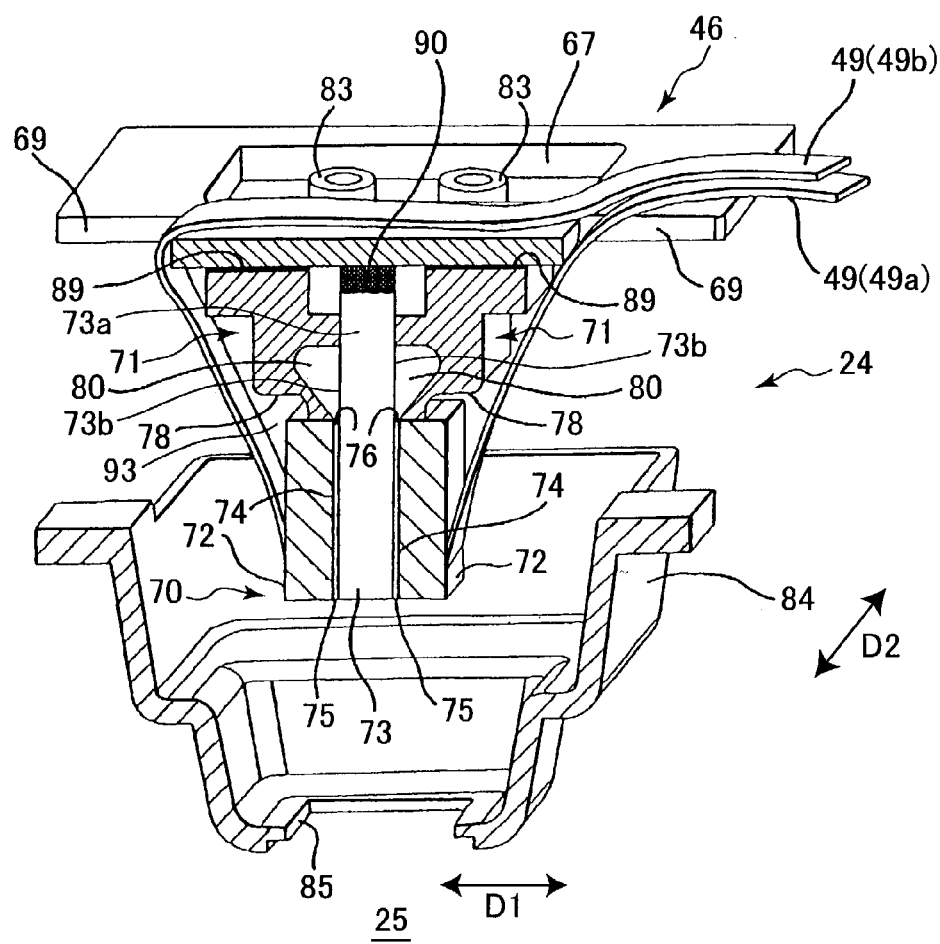

INK JET RECORDING DEVICE

This is a (1) Continuation of application Ser. No. 09/899,287 filed Jul. 6, 2001 abandoned and a (2) Continuation-In-Part of application Ser. No. 09/049,046 filed Mar. 27, 1998 now U.S. Pat. No. 6,270,205 B1 issued Aug. 7, 2001. The entire disclosures of the prior applications are hereby incorporated by reference herein in their entireties.

BACKGROUND OF THE INVENTION

1. Field of the Invention

The present invention relates to an ink jet printer that forms images on a recording sheet and the like by ejecting ink from nozzles.

2. Description of the Related Art

Conventional printers and other recording devices are provided with a recording head for forming images on a recording sheet. Normally, such recording heads are mounted in a carriage that moves along a widthwise direction of the recording sheet, and a flexible wiring board is connected to the recording head for driving the same. The flexible wiring board is in connection with a wiring plate, which is connected to a circuit provided to a main body of the recording device. With this configuration, the recording head is controlled through the flexible wiring board to perform printing.

Examples of this type of recording head include ink jet heads, dot impact heads, and thermal transfer heads. Among these, the ink jet head is known to have a relatively simple construction, perform high-speed printing, and achieve high quality.

As shown in FIG. 1, an example of this type of ink jet printer includes a head unit provided an ink cartridge 1, a head holder 2, and an ink jet head 3 attached to the head holder 2.

The ink cartridge 1 is formed of a resin material and includes a porous member chamber 4 and an ink chamber 5. The porous member chamber 4 accommodates a porous member filled with ink. The ink chamber 5 is separated from the porous member chamber 4 and formed with an ink supply inlet 6. The head holder 2 is also formed of a resinous material and accommodates the ink cartridge 1. The head holder 2 is formed with a communicating hole 7 at a position confronting the ink supply inlet 6 of the ink chamber 5.

The ink jet head 3 includes an actuator 8 and a manifold 9. The actuator 8 is formed of a piezoelectric ceramic material and is formed with a plurality of ejection channels (not shown). The actuator 8 and the manifold 9 are joined by a UV adhesive after positioning the two at a prescribed position in relation to each other, and a silicon type potting material is formed around the ink channels to form a seal.

The manifold 9 is formed of a resin and includes an ink introducing unit 11 formed with an ink introducing channel 10 connected to the ink supply inlet 6 and an ink supply unit 13 formed with an ink supply channel 12 for distributing ink to the ejection channels of the actuator 8.

A sealing member 14 formed of a ring-shaped elastic material is adhesively fixed to the inner surface of the communicating holes 7. By inserting the ink introducing unit 11 through the sealing member 14, the ink introducing channel 10 is connected to the ink supply inlet 6 via the sealing member 14.

A base plate 15 formed of a metal material is interposed between the sealing member 14 and the ink supply unit 13. The base plate 15 serves to set the ink jet head 3 at a reference position. By fixing the ink supply unit 13 to the base plate 15, the ink jet head 3 becomes supported on the base plate 15. The base plate 15 is adhesively fixed to the head holder 2 via the sealing member 14.

The actuator 8 is provided with an ejection energy generating unit (not shown). A chip-on-board (COB) 17, on which a drive circuit is mounted, is connected to the ejection energy generating unit via a flexible wiring board 16 for generating pulse signals to drive the actuator 8 so as to eject ink droplets from the ejection channels.

When the head holder 2 is mounted in a carriage (not shown), contact points of the COB 17 contact contact points of a wiring plate provided on the carriage. A lock member applies pressure to the contact points of the head holder 2 and the carriage, and fixes these two components so as to maintain both components in a state of contact. As is well known in the art, the wiring plate on the carriage connects to a control circuit board of the recording device via a flexible cable.

Ink in the ink cartridge 1 is supplied via the ink supply inlet 6 and the ink introducing channel 10 of the manifold 9 to the ink supply channel 12. From the ink supply channel 12, the ink is distributed to each ejection channel of the actuator 8. The ejection energy generating unit changes the capacity of each ejection channel based on ejection pulse signals emitted from the COB 17. When the capacity of the ejection channel is reduced, an ink droplet is ejected from the corresponding nozzle. When the capacity is increased, ink is reintroduced into the ejection channel. By performing these operations repeatedly, a prescribed image is formed on recording sheet.

In this type of ink jet head 2, it is necessary for the lock member on the head holder 2 to firmly press the COB 17 in order to ensure a reliable connection between the COB 17 and the wiring plate on the carriage. However, the head holder 2 can warp under the strong pressure. Also, an elastic member formed of rubber or the like that pushes the wiring plate on the carriage toward the COB 17 applies a reaction force on the contacts to the COB 17. This can potentially cause positional deviation in the base plate 15 that is adhesively fixed to the head holder 2 or the manifold 9 and the actuator 8 supported on the base plate 15. When such positional deviations occur, the nozzles of the actuator 8 are also forced out of position, making it impossible to achieve a sufficient print quality.

Also, the UV adhesive used for joining the manifold 9 and the actuator 8 is cured by exposure to ultraviolet light. After hardening, the adhesive is relatively flexible. The silicon potting material also has a relatively flexible quality, like an elastic rubber, after hardening.

That is, the bond between the manifold 9 and the actuator 8 is not very firm. Accordingly, the positional relationship between the manifold 9 and the actuator 8 could be thrown off by heat or external forces applied during processes that follow assembly of the ink jet head 3, and also by pressure from the ink cartridge 1 or from a protective cap during purging operations or when the printer is not being used. Should such deviation in the position occur, air bubbles may become trapped in the gap between the manifold 9 and the actuator 8 when using the ink jet printer. Since the surface area in which the air bubbles can contact the silicon potting material is large, the trapped air bubbles can grow and result in ejection problems after the printer has been at rest.

Also, these deviations can offset the position of the nozzles in relation to the base plate 15, making it impossible to achieve satisfactory printing quality.

Further, while the manifold 9 is formed of a resin, the base plate 15 is formed of a metal material having a considerably different linear expansion coefficient (about 9 times larger). As a result, changes in temperature can cause peeling and cracking to occur between the manifold 9 and the base plate 15, causing positional deviation of the nozzles in relation to the base plate 15. In this case, it is not possible to achieve satisfactory printing quality.

Further, the ink introducing unit 11 of the manifold 9 is connected to the ink supply inlet 6 of the ink cartridge 1 via the communicating holes 7 of the head holder 2. Accordingly, the position of the nozzles in the actuator 8 is easily affected by the ink cartridge 1 and the head holder 2. Pressure from the ink cartridge 1 directly affects the manifold 9. This type of pressure can easily cause positional deviations of the nozzles in relation to the base plate 15.

The above described head unit also includes a filter 18 provided on the ink inlet of the manifold 9 for removing foreign matter, air bubbles, and the like that can generate problems in ink ejection. The filter 18 has a mesh diameter smaller than the diameter of the nozzles.

During the assembly, the filter 18 is first welded to the ink inlet of the manifold 9, and then the actuator 8 is fixed to the manifold 9.

After the assembly, various ejection tests are performed to determine whether ink is properly ejected without the nozzles becoming clogged with foreign matter. In these ejection tests, water is introduced through the filter 18 into the manifold 9 and actuator 8. If the nozzles are not clogged with foreign matter, the water will flow out of the nozzles in a straight line. However, if the nozzles are clogged with foreign matter, water will come out of the nozzles at an angle. When water comes out of the nozzles at an angle, the ink jet head 3 is considered a reject and is not passed on to subsequent processes.

Ink jet heads 3 that are rejected in these ejection tests can be reused, provided the foreign matter is removed from the nozzles. However, it is not possible to clean the nozzles by forcing water rear through in the reverse direction when the filter 18 is welded in the manifold 9. Hence, the ink jet head 3 must be disposed.

In light of this problem, there have been proposals for an ink jet head in which the head is screwed to a head holder in order to fix the ink jet head in a reference position. The head holder is also provided with a member that supports a filter. When nozzles become clogged with foreign matter, the ink jet head is removed from the head holder and water is force rearward from the nozzles. Subsequently, the head holder is reattached and the ink jet head can be reused.

However, this method is inconvenient in that it requires considerable effort. After satisfactorily fixing the ink jet head at a reference position with the head holder, the head holder must be temporarily removed and reattached. When reattaching the head holder, it is necessary to reset the head holder to its original reference position and firmly fix the head holder in position with screws. Moreover, after repeatedly removing and reattaching the head holder with the screws, the screws begin to lose their ability to firmly fix the head holder and the inkjet head must be disposed.

Also, the circuit board mounts the circuit element on one surface and a radiator attached to the other surface. Because the radiator is produced by punching an aluminum alloy material, burrs are formed on the edges of the radiator.

If such a radiator with burrs formed on the edges is attached to the circuit board with the burrs opposing the circuit board, the burrs can scratch a pattern in the circuit board, causing electrical disconnections or shorts. If the radiator is attached to the circuit board with the burrs facing outward, the burrs can scratch a flexible printed circuit board connected to the circuit board, causing wiring breaks and shorts also.

Further, since adhesive is applied to the entire surface of the radiator when attached to this type of conventional circuit board, the circuit board can be warped by differences in the linear expansion coefficient between the radiator and the circuit board.

Also, in this type of ink jet recording head, the ink supply channel 12 and the like are formed by fixing a center plate of the actuator 8 to the manifold 9. A space, such as a groove or depression, is formed between the center plate and the manifold 9 along the outside of the ink supply channel 12 and the like. When fixing the center plate to the manifold 9, a sealing agent is introduced into the space by inserting a fine pipe dispenser therein, so as to prevent ink leakage and also to prevent air from entering the ink in the ink introducing channel 10 and the ink supply channel 12. The fine pipe dispenser helps maintaining the fluidity of the sealing agent.

However, when the space is deep, the sealing agent blocks the entrance to the space, trapping air bubbles that have no means of escape, so that the sealing agent does not reach all the way to the innermost part of the space. Also, because the ink jet head 3 is small in size, the space is even smaller. It is difficult to insert the dispenser into such a small space. This increases the possibility of trapped air bubbles. The air bubbles trapped in the space in this manner makes sealing capacity insufficient, generating ink leakage and allowing small amounts of external air into ink in the ink supply channel 12 and the like.

Extremely small air bubbles contained in the ink within the ink supply channel 12 have little effect on ink ejection. However, when external air enters through miniature gaps between the center plate and the manifold 9, air bubbles are formed in the ink and become trapped in the ink supply channel 12 and the ejection channels, thereby generating problems in ink ejection.

Usually, a sealing agent having a low air permeability is used to seal the contact points between the center plate and the manifold 9. Such sealing agents ensure to prevent air from entering the ink supply channel 12. Most sealing agents with a low air permeability require curing by heat and firmly fix the center plate to the manifold 9.

However, the linear expansion coefficient of the material used in the center plate and the manifold 9 is often different. If these two members are adhered firmly to each other, changes in ambient temperature and temperature changes when manufacturing the ink jet head 3 can generate warping or cracking between the center plate and the manifold 9 due to the different linear expansion coefficients. Such warping or cracking greatly increases the amount of external air that enters.

Since the sealing agent directly contacts ink that leaks through gaps between the center plate and the manifold 9, it is necessary for the sealing agent to have a high resistance to ink. However, sealing agents having a high resistance to ink generally have a high air permeability at the same time.

When installing a filter in two joint members having an ink channel, such as the filter 18 between the ink cartridge 1 and the ink jet head 3 jointed together, the filter can be preinstalled in the joint members by heat, welding, or the like, and the two joint members are joined together by ultrasonic welding. In this case, the ultrasonic waves vibrate the center portion of the filter, causing the outer portion of the filter to peel from the joint members. Rather than peeling, in some cases the vibrations cause the center portion of the filter to contact the inner side of the ink channel and become fused thereon. If the filter is maintained in this deformed state, the effective surface area of the filter is reduced, thereby hindering the supply of ink and greatly affecting the printing result.

It is necessary to increase the amount of ink supplied per unit time from the ink cartridges when increasing the number and density of ink channels in the ink jet head. Also, the filter pores (miniature openings in the filter) are decreased in size to raise the filtration precision, it is necessary to enlarge the effective area of the filter. Since the possibility of foreign matter entering the ink is largest when connecting or detaching the cartridge to the ink jet head, a filter is generally installed on the ink jet head at the point of connection. However, it is difficult to seal the connection point between the ink jet head and ink cartridge when the filter has a large effective area. This potentially results in ink leakage and the generation of air bubbles in the ink channels from external air entering therein. Moreover, as the surface area of the filter becomes larger, the chance for dust and other foreign matter from becoming deposited on the filter grows larger when the ink cartridge is in a detached state.

It is conceivable to install the filter in the ink channels separated a sufficient distance from the point of connection, enabling the connection point to be reduced without concern for the size of the filter. However, in this configuration, ink may leak from the nozzles when the ink cartridge is removed from the ink jet head. Usually, a negative pressure generator, such as a porous foam in the ink cartridge, applies a negative pressure to the ink that is supplied to the ink jet head and prevents ink from leaking from the nozzles. However, atmospheric pressure works on the ink in the ink jet head when the ink cartridge is not connected thereto. At this time, when ink droplets become deposited around even one of the plurality of nozzles, the meniscus of ink in the nozzle becomes broken, allowing ink to flow due to a water head difference H (see FIG. 6) between the connection part and the nozzle. In other words, ink leakage occurs. Leaking ink spreads around the other nozzles, affecting their ejecting properties, such as bending the direction of ink ejection during an ejection operation, further soiling the inside of the main recording device with ink, and decreasing the quality of the image formed on the recording paper.

SUMMARY OF THE INVENTION

In view of the foregoing, it is an object of the present invention to provide a recording device having a simple construction and capable of preventing positional deviations in the recording head and achieving satisfactory print quality, while reliably connecting the flexible wiring board to the wiring plate connected to the circuit of the main recording device.

It is other object of the present invention to provide an ink jet printer having a simple construction for reliably fixing the manifold to the actuator while preventing positional deviation between the two, and capable of effectively preventing problems in ink ejection caused by air bubbles that occur after the printer has been at rest.

It is other object of the present invention to provide an ink jet recording device capable of performing high-quality printing, while reducing the positional deviations of nozzles caused by pressure from the ink cartridge, pressure from the protective cap during purging operations or when the device is not in use, and effects from other components and environmental changes.

Further, it is an object of the present invention to provide an ink jet head unit to which a simple method can be performed to restore clogged nozzles and to enable the inkjet head to be reused rather than disposed, and also to provide an ink jet device equipped with this ink jet head unit.

Moreover, it is an object of the present invention to provide a circuit board capable of preventing warping due to heat, as well as wire breaks and shorts when a radiator formed with burrs on its edges are attached thereto.

Still further, it is an object of the present invention to provide an ink jet recording head capable of sealing the junction between a first component and a second component forming the ink channels, in order to prevent the growth of air bubbles in the ink channels, the ink leakage from the ink channels, and the small air bubbles from entering the ink, and also capable of eliminating problems resulting from deformation and the like that result when expansion variations occur in the first and second components.

It is an object of the present invention to provide an ink supply device and an ink jet head capable of minimizing the amount of vibrations to the center portion of the filter that incurs the effects of ultrasonic waves during ultrasonic welding performed to join two members together, capable of preventing the filter from peeling or deforming, and capable of exhibiting sufficient functions of the filter even when the filter is deformed to ensure an adequate supply of ink, and also to provide methods of manufacturing an ink supply device and the ink jet head.

It is an object of the present invention to set the connection part at a size conducive for securing a seal between the ink jet head and the ink supply source and to maintain the proper ink supply level when increasing the size of the filter used to remove foreign matter, while increasing the life of the filter and preventing ink leaking from nozzles when an ink supply source is removed from the ink jet head.

In order to achieve the above and other objectives, there is provided a recording device including a main body circuit, a recording head, a flexible wiring board, a supporting member, an attaching unit, and a pressing unit. The recording head is provided with a plurality of recording elements. The flexible wiring board drives the plurality of recording elements and has a first end connected to the recording head and a second end provided with first contacts. The second wiring board is provided with second contacts that detachably contact the first contacts of the flexible wiring board. The second wiring board is connected to the main body circuit. The supporting member includes a first support that supports the recording head and a second support that supports the second wiring board. The attaching unit attaches the recording head to the first support while regulating an attaching position of the recording head with respect to the first support. The pressing unit presses the flexible wiring board and the second wiring board so as to contact the first contacts of the flexible wiring board to the second contacts of the second wiring board. The pressing unit is provided independent from the attaching unit.

In this configuration, the recording head can be reliably supported by the attaching unit that is independent from the pressing member even when the pressing unit contacts the first contacts of the flexible wiring board to the second contacts of the second wiring board by pressing the first and second contacts. Accordingly, the pressing force of the pressing member does not affect the attachment position of the recording head relative to the first support, so the positional deviation of the recording head is prevented, resulting in preferable printing.

There is also provided with an ink jet head unit including a base plate, an ink jet head, and a filter. The ink jet head includes an actuator formed with a plurality of ink channels each having an inlet port and a channel-defining member. The channel-defining member includes a manifold that is attached to the actuator for supplying an ink to each of the plurality of ink channels through the inlet ports and a joint unit that receives an external ink supply member and is detachably mounted to the base plate. The joint unit is formed with an ink-supply channel through which an ink from the external ink supply member is introduced into the manifold. The filter is provide to the ink-supply channel.

In the above configuration, because the filter is provided to the ink-supply channel formed to the joint unit, and because the joint unit is detachable from the base plate to which the actuator is fixed, water can be forced rearward through the ink channels when the ink channels become clogged with foreign matter. Accordingly, it is possible to restore proper ejection and to reuse instead of dispose of the ink jet head unit.

Further, there is provided an ink jet recording device including an ink jet head unit that includes a base plate and an ink jet head. The ink jet head includes an actuator and a channel-defining member. The actuator is formed with a plurality of ink channels each having an inlet port, and the actuator is fixed to the base plate. The channel-defining member includes a manifold that is attached to the actuator for supplying an ink to each of the plurality of ink channels through the inlet port and a joint unit that receives an external ink supply member and is detachably mounted to the base plate. The joint unit is formed with an ink-supply channel through which an ink from the external ink supply member is introduced into the manifold.

Moreover, there is provided an ink jet recording device including an ink jet head and a base plate. The ink jet head includes an actuator and a channel defining member. The actuator includes a channel member having a first surface being formed with a plurality of grooves each extending in a first direction and a cover member having a first surface attached to the first surface of the ejection channel member, thereby defining a plurality of ejection channels between the cover member and the channel member. Each of the ejection channels having an inlet port. The cover member has a height in the first direction that is greater than a height of the channel member such that the cover member has a protruding portion that is protruding in the first direction from the channel member. The channel defining member includes a manifold for supplying an ink to the plurality of ejection channels through the inlet ports. the base plate supports the ink jet head and is in confrontation with the protruding portion of the cover member with a first space formed therebetween. The manifold is positioned between the base plate and the channel member at a side of the protruding portion of the cover member with a second space formed between the manifold and the base plate. The second space is smaller than the first space. The manifold is attached to the channel member and the side of the protruding portion of the cover member. Both the first and the second spaces are filled with an adhesive, thereby attaching the base plate to both the cover member and the manifold.

Because the second space is set smaller than the first space, the adhesive in the first space contracts more the adhesive in the second space. Accordingly, the cover member is pulled with more force by the adhesive toward the base plate than the manifold. By being disposed between the base plate and the channel member, the manifold constantly applies an elastic urging force to the channel member. As a result, the manifold and the actuator are reliably fixed together, preventing positional deviations between the two even when heat and external forces are applied.

There is also provided with an ink jet recording device including an ink jet head that includes an actuator formed with a plurality of ejection channels through which ink droplets are ejected and a channel defining member attached to the actuator and a base plate that supports the ink jet head at a predetermined position. The actuator is directly attached to the base plate, and the channel defining member is attached to the base plate and supplies an ink to the plurality of ejection channels.

Because the actuator is directly fixed to the base plate, the position of the actuator is directly regulated by the base plate regardless of the adhering force between the actuator and the channel-defining member. This configuration prevents positional deviation of the actuator due to pressing force from other components.

BRIEF DESCRIPTION OF THE DRAWINGS

In the drawings:

FIG. 7 is an exploded cross-sectional view taken along the line VII—VII of FIG. 6;

PREFERRED EMBODIMENT OF THE PRESENT INVENTION

Next, a color ink jet printer 21 according to an embodiment of the present invention will be described while referring to the accompanying drawings.

In the following description, the expressions "above", "upward", "downward", and "vertical" are used throughout the description to define the various parts when the printer 21 is disposed in an orientation in which it is intended to be used.

Figure 1:
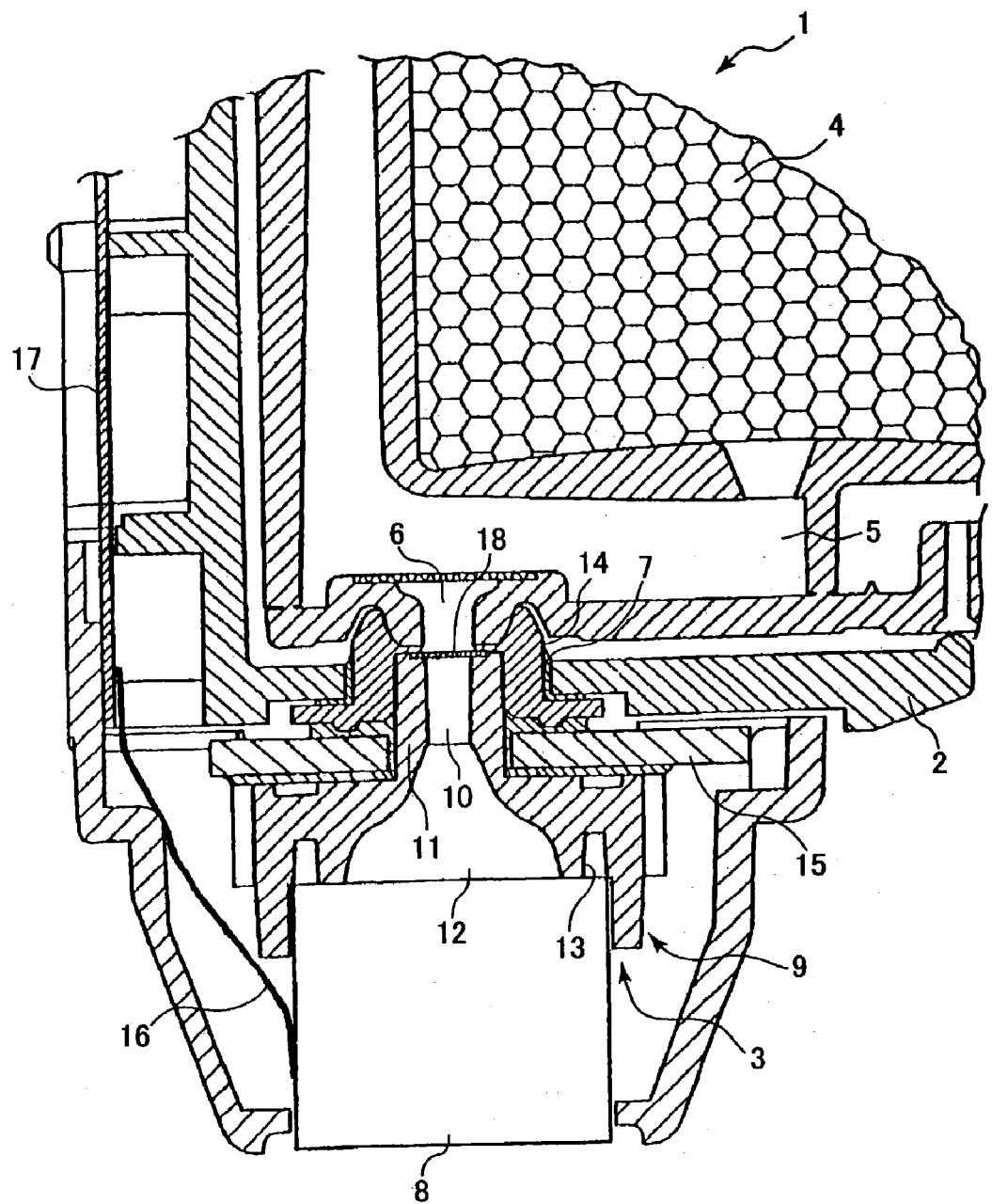
FIG. 1 is a cross-sectional view showing components of conventional ink jet recording device.
Figure 2:
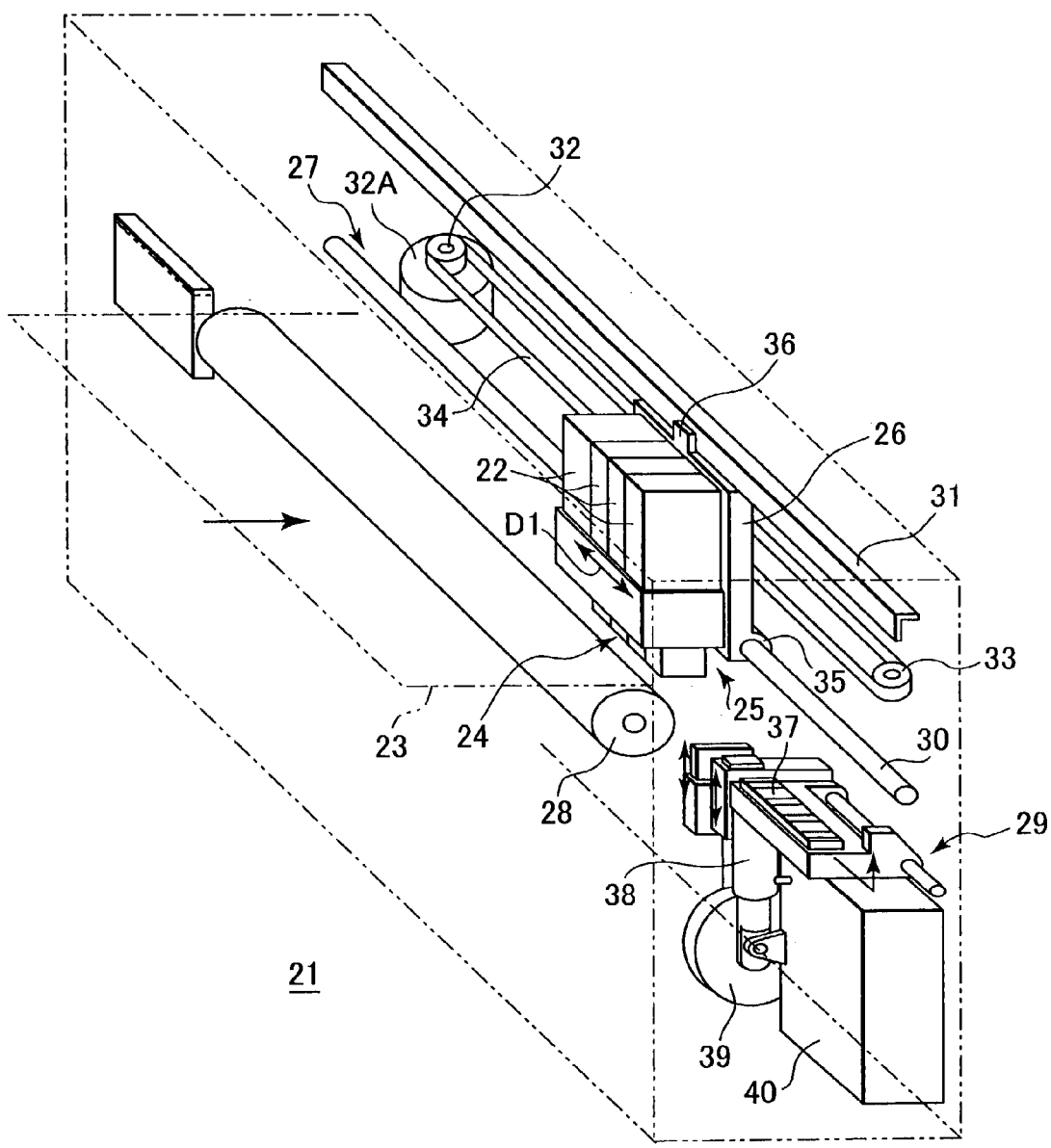
FIG. 2 is a perspective view of a color ink jet printer according to an embodiment of the present invention.
Figure 3:
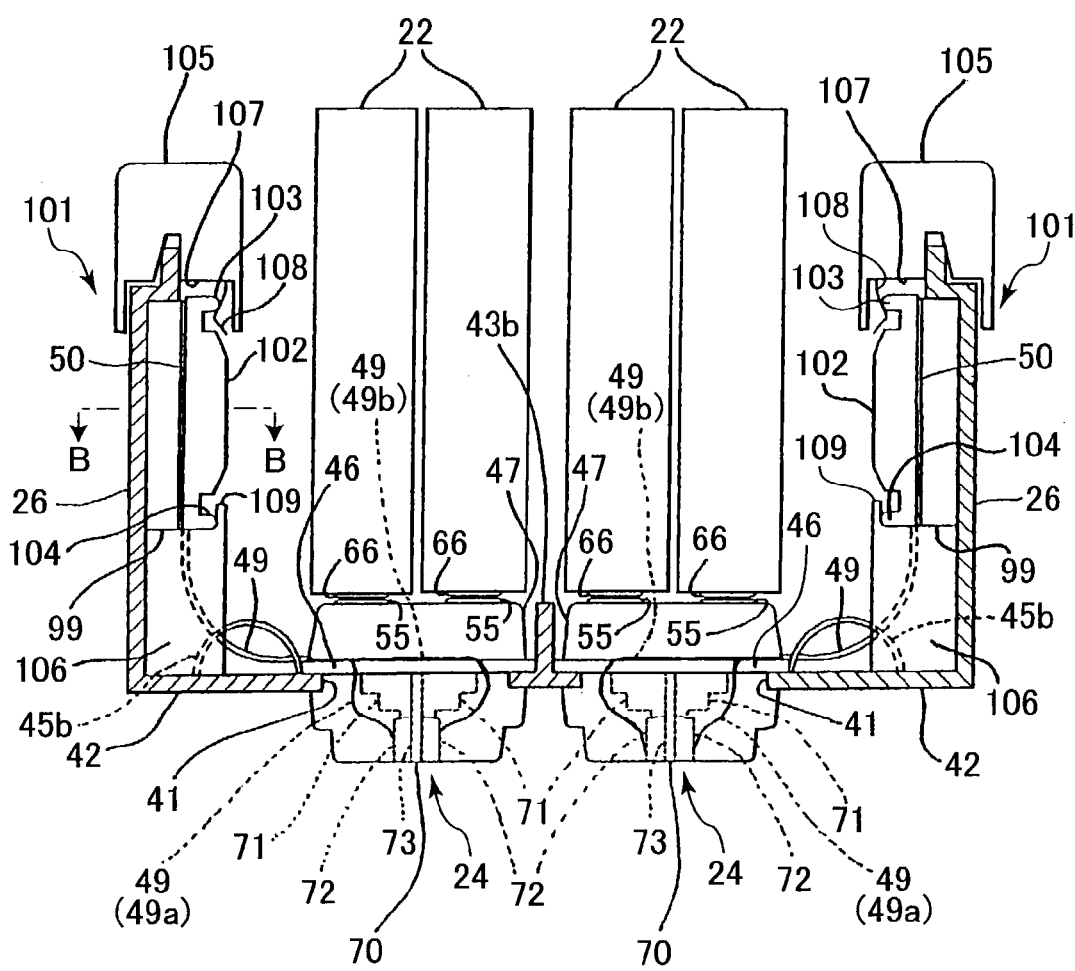
FIG. 3 is a front view of a head unit and an ink cartridges assembled onto a cartridge of the color ink jet printer of FIG. 2.

As shown in FIGS. 2 and 3, the color ink jet printer 21 includes ink cartridges 22, a pair of head units 25, a carriage 26, a drive unit 27, a platen roller 28, and a purging device 29.

Figure 4:
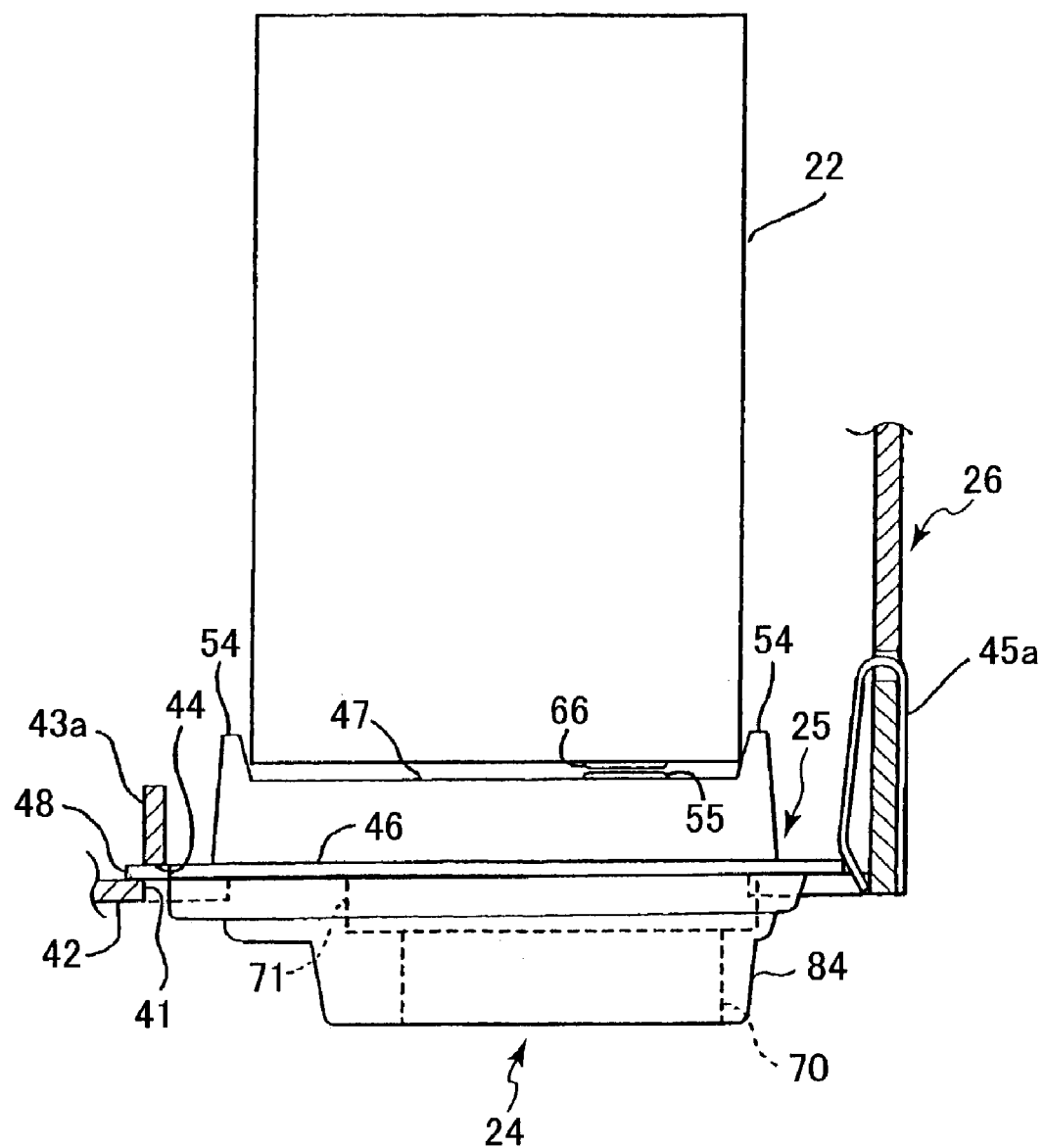
FIG. 4 is a side view showing of the head unit and the ink cartridge assembled onto the cartridge of FIG. 3.

Each of the ink cartridges 22 is filled with one of four colors of ink, including cyan, magenta, yellow, and black. The ink cartridge 22 is provided with supply units 66 and mounted on the head unit 25 in a manner shown in FIGS. 3 and 4. As shown in FIGS. 6, 7, 12, and 13, each the head unit 25 includes an ink jet head 24, a base plate 46, and a head cover 84. The ink cartridges 22 and the pair of head units 25 are mounted on the carriage 26. The drive unit 27 linearly and reciprocally moves the carriage 26 in a widthwise direction D1. The platen roller 28 is disposed confrontation with the ink jet head 24 and extends in the widthwise direction D1.

The drive unit 27 includes a carriage shaft 30, a guide plate 31, a pair of pulleys 32 and 33, an endless belt 34, a carriage shaft support 35, and a guide plate contact 36. The carriage shaft 30 is disposed on the bottom of the carriage 26. The guide plate 31 is disposed on the top of the carriage 26. The carriage shaft 30 and the guide plate 31 are both extending parallel to the carriage 26 in the widthwise direction D1. The pulleys 32 and 33 are disposed one on either end of the carriage shaft 30 at positions between the carriage shaft 30 and the guide plate 31. The endless belt 34 is looped around the pulleys 32 and 33, and is joined to the rear surface of the carriage 26.

The carriage shaft support 35 is provided on the bottom of the carriage 26, and the carriage shaft 30 is inserted through the carriage shaft support 35. The guide plate contact 36 is provided on the top of the carriage 26 for contacting the guide plate 31.

A motor 32A is provided for driving the pulley 32 to rotate in the forward or reverse direction. When the pulley 32 rotates, the carriage 26 joined to the endless belt 34 moves reciprocally along the carriage shaft 30 and the guide plate 31 linearly in the widthwise direction D1.

Although not shown in the drawings, a recording sheet supply cassette is disposed on the side of the ink jet printer 21 for supplying a recording sheet 23 into a position between the ink jet head 24 and the platen roller 28. The ink jet head 24 ejects ink onto the recording sheet 23 so as to form prescribed images thereon. Subsequently, a discharging mechanism (not shown) discharges the recording sheet 23.

The purging device 29 is disposed to the side of the platen roller 28 and opposes the ink jet head 24 when the head unit 25 is in a predetermined reset position. The purging device 29 includes a protecting cap 37, a pump 38, a cam 39, and an ink reservoir 40. When the head unit 25 is in the reset position, the protecting cap 37 covers the ink jet head 24. The cam 39 drives the pump 38 to extract defective ink remaining in the ink jet head 24 that contains air bubbles and the like to restore the ink jet head 24. The defective ink drawn out of the ink jet head 24 is collected in the ink reservoir 40. In this way, the purging device 29 prevents problems in ink ejection caused by residual ink or growing bubbles that exist when ink is initially introduced in the ink jet head 24 for example.

As shown in FIG. 7, the ink jet head 24 includes an actuator 70, a joint unit 47, and a pair of manifolds 71. The actuator 70 and the manifolds 71 are supported on a lower surface of the base plate 46, and the joint unit 47 is mounted on an upper other surface of the base plate 46. When the ink jet head 24 is mounted on the carriage 26, the ink jet head 24 is supported onto the carriage 26 by the carriage 26 in a manner described later.

Figure 10:
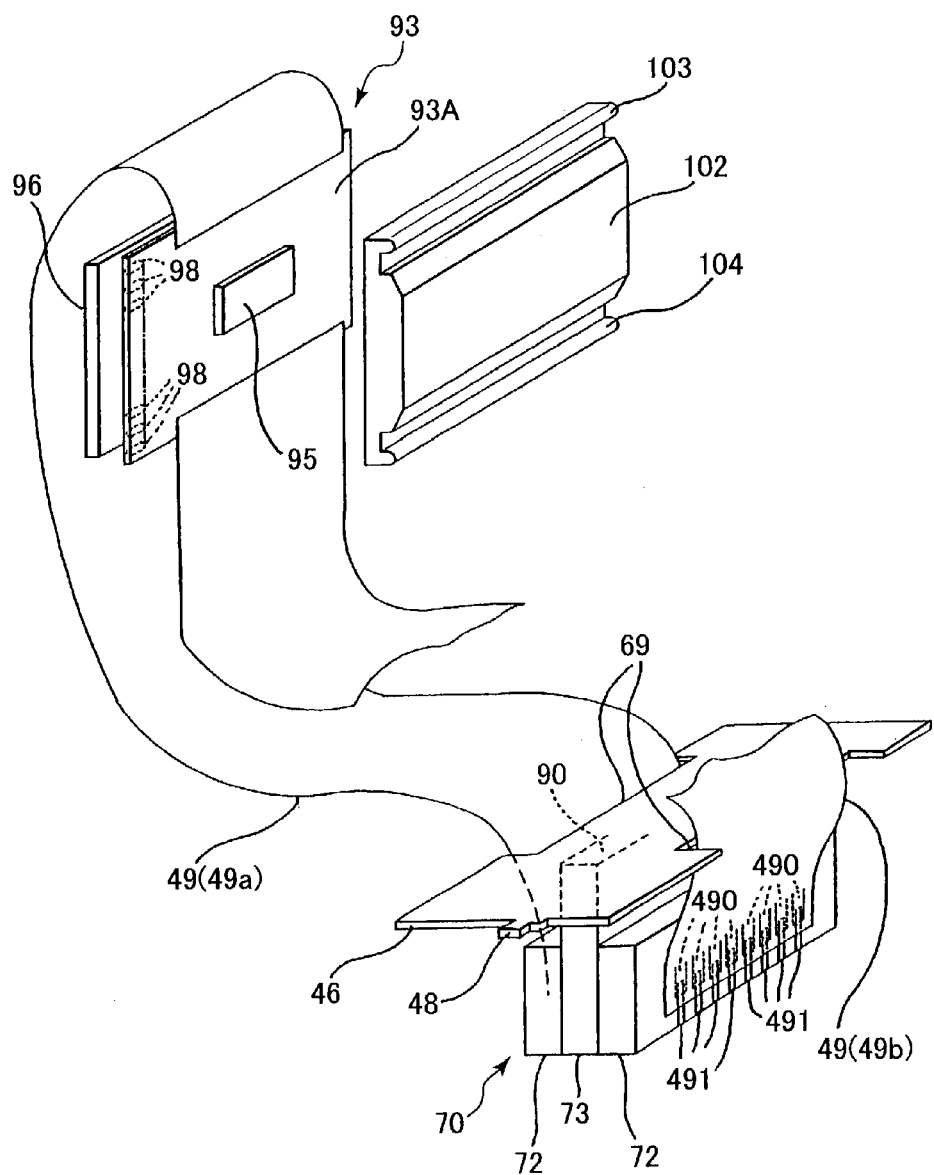
FIG. 10 is an explanatory view showing connection of flexible wiring boards.

The joint unit 47 and the manifolds 71 serve as channel forming members for supplying ink from the ink cartridges 22 to the actuator 70. The actuator 70 is formed with a pair of rows of ejection channels 74. As shown in FIGS. 7 and 10, a flexible wiring board 49 is provided on the actuator 70 and connected to corresponding row of ejection channels 74 for transmitting drive signals. Specifically, the flexible wiring board 49 includes terminals 490 each connected to one of terminals 491 in electrodes provided in the ejection channels 74.

Figure 6:
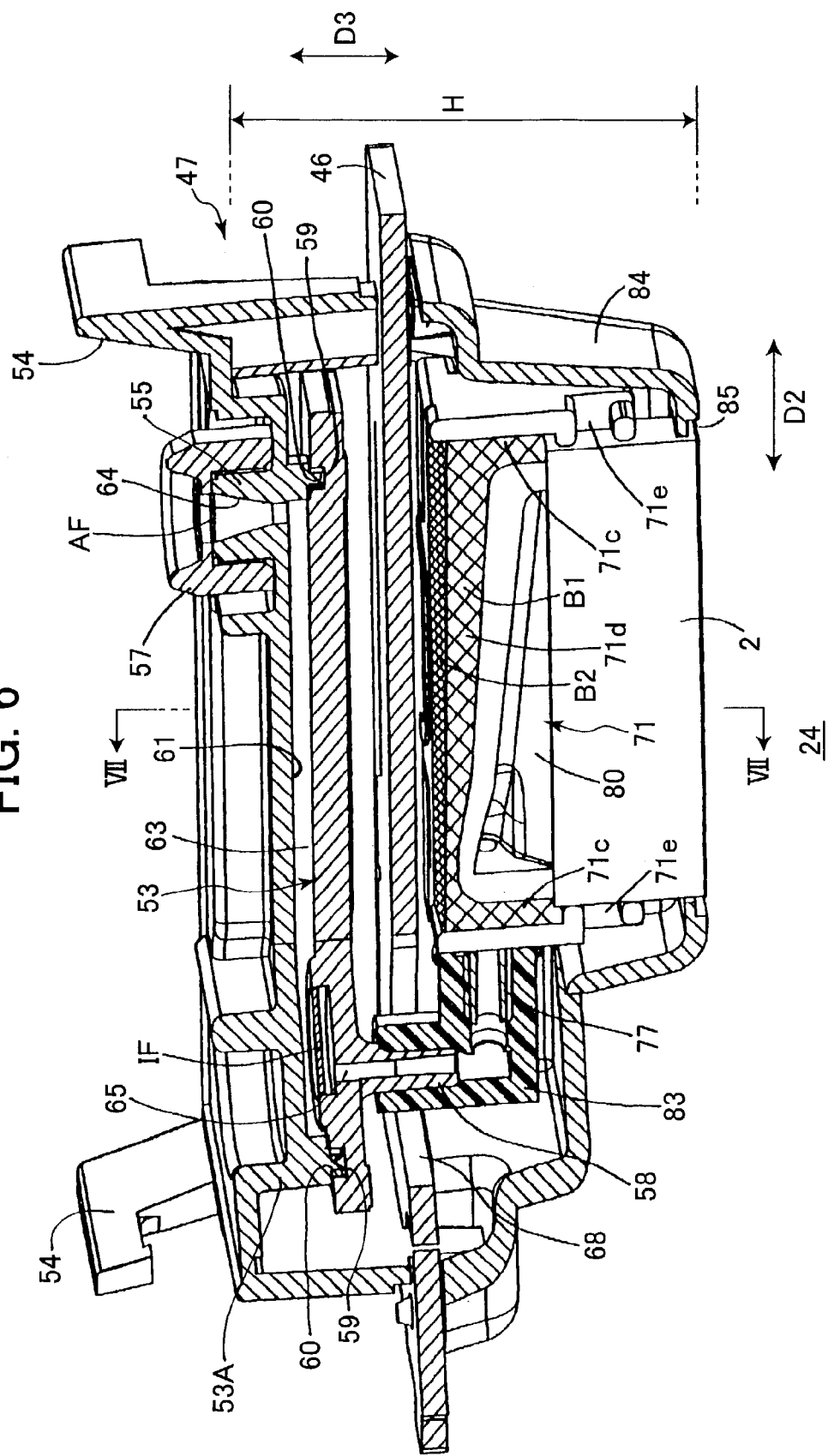
FIG. 6 is a cross-sectional view of an ink jet head.
Figure 11:
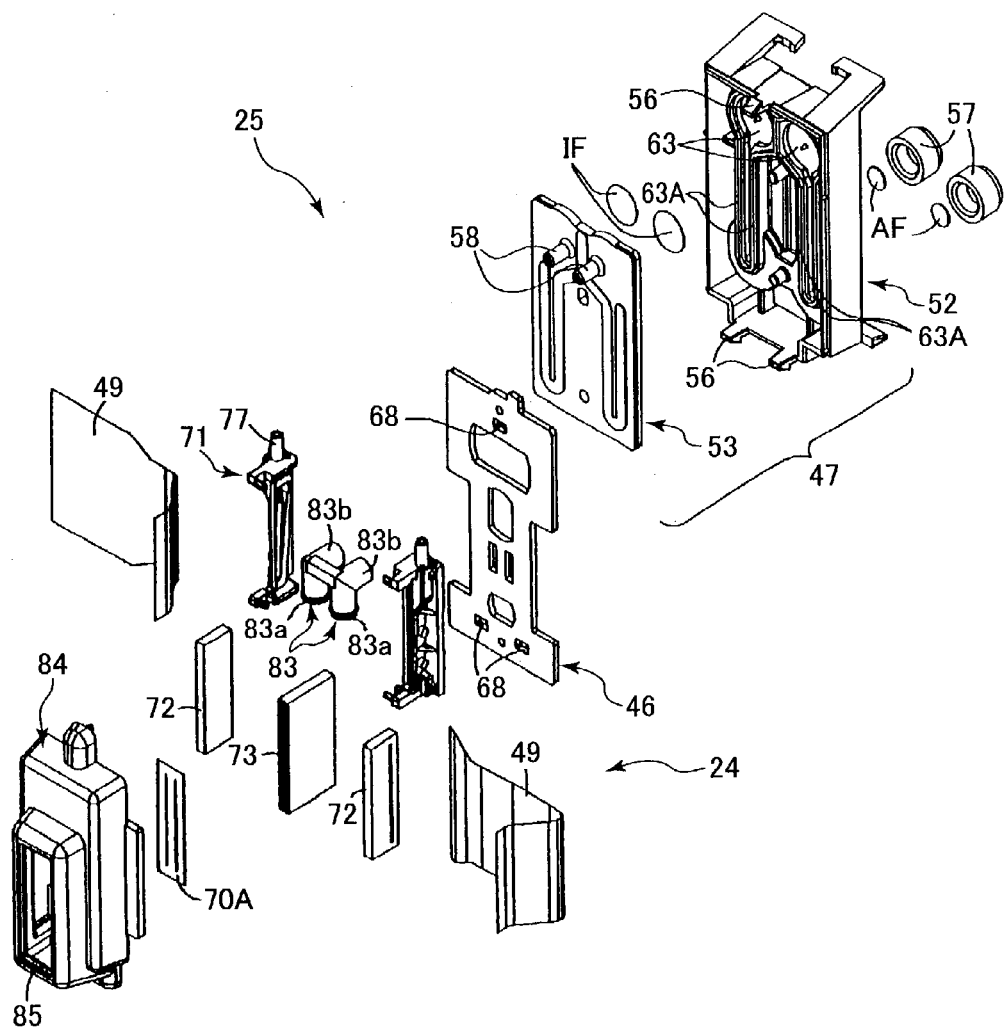
FIG. 11 is an exploded perspective view showing relevant parts of the head unit.
Figure 12:
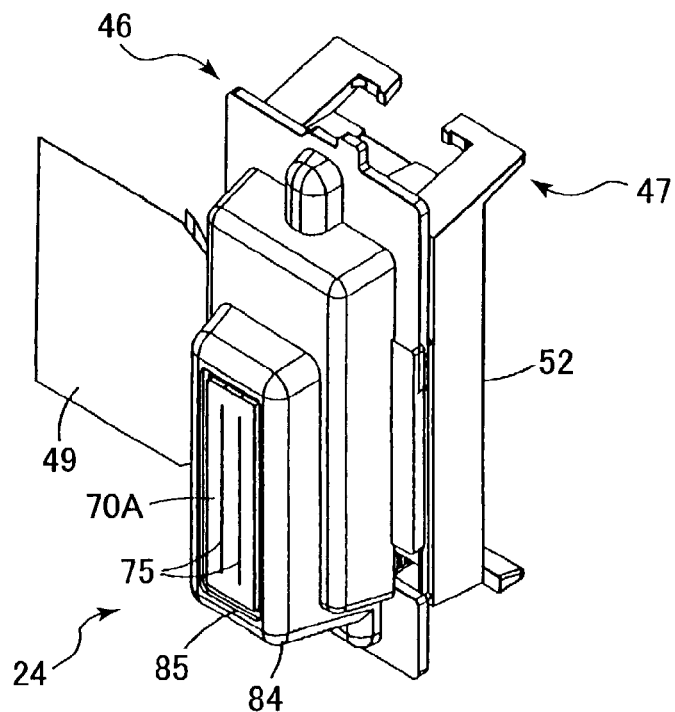
FIG. 12 is an enlarged perspective from the ink ejection side of the head unit.
Figure 13:
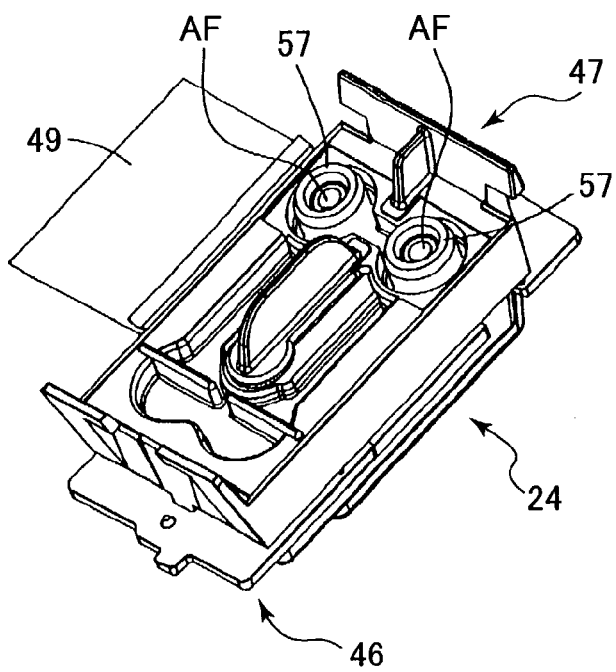
FIG. 13 is an enlarged perspective view from the opposite side in FIG. 12 of the head unit.
Figure 14:
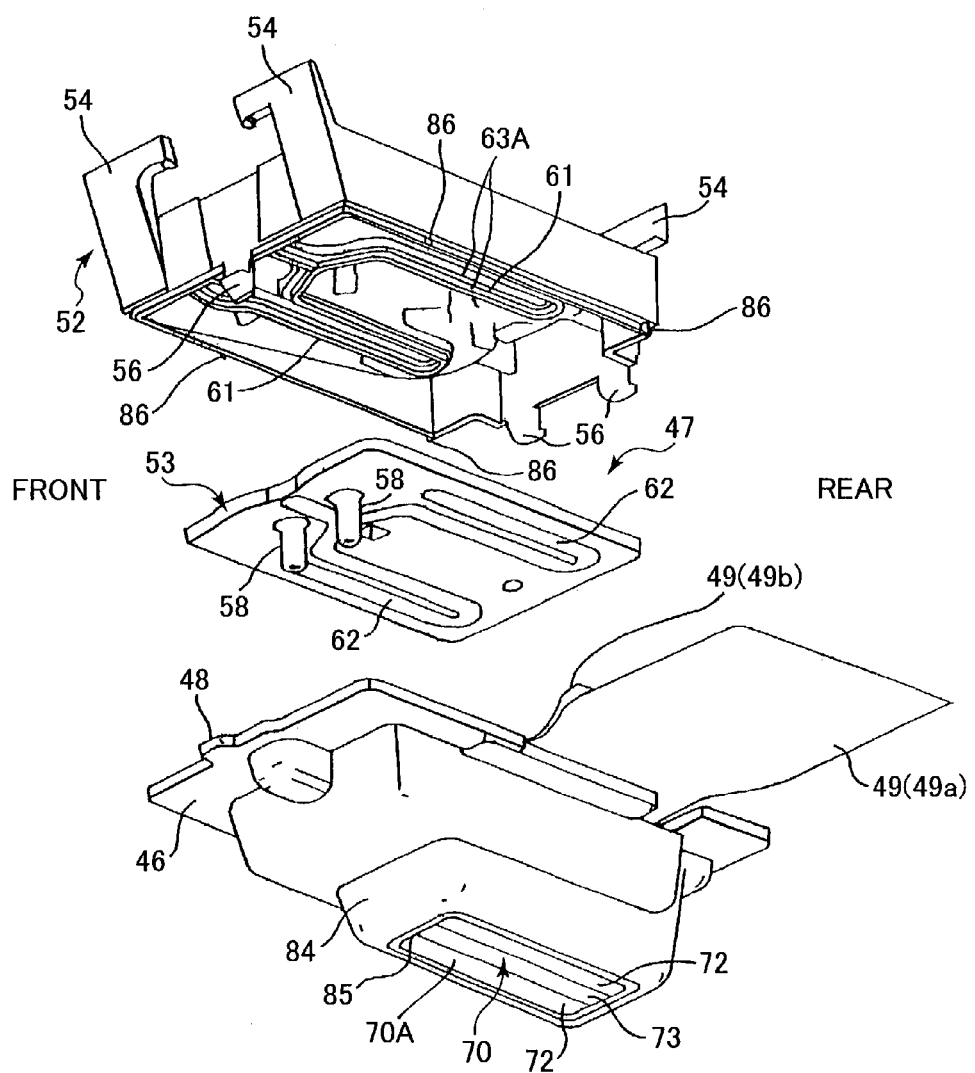
FIG. 14 is an exploded view of the head unit viewed from the bottom.

As shown in FIGS. 7 and 11, the actuator 70 includes a center plate 73 fixed between a pair of channel members 72 by an adhesive. A nozzle plate 70A is also joined to one side surface of the actuator 70 by adhesive. The nozzle plate 70A is formed with two rows of nozzles 75 through which ink is ejected. As shown in FIGS. 6, 7, and 14, the head cover 84 is attached to the base plate 46, and the actuator 70 is incorporated inside the head cover 84 while the nozzle plate 70A is exposed externally via a cover opening 85 formed in the head cover 84.

Figure 5:
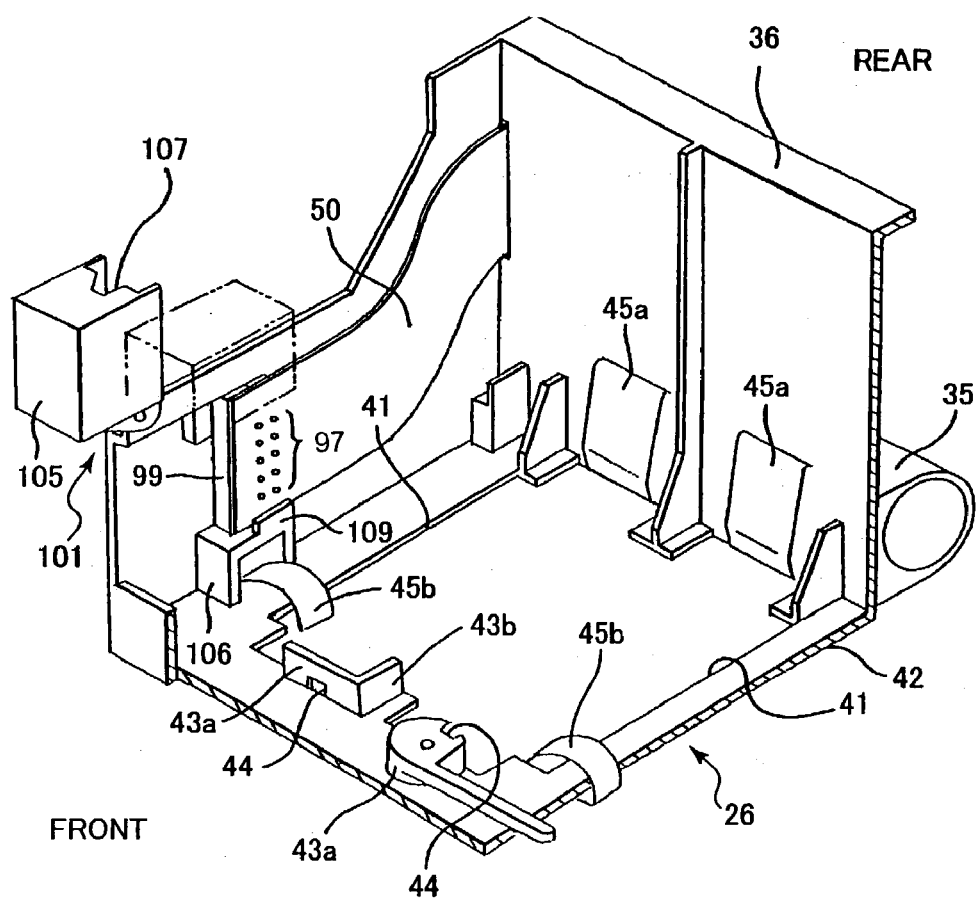
FIG. 5 is a perspective view of the carriage.

As shown in FIG. 5, the carriage 26 has a box shape with a bottom wall 42. Two openings 41 having a substantially rectangular shape are formed in the bottom wall 42 next to each other. Engaging members 43a and 43b formed with the engaging groove 44 are provided on the front edge of the openings 41, and plate springs 45a and 45b are disposed at the rear and sides of the openings 41 at positions opposite the engaging members 43a and 43b. As shown in FIGS. 3 and 4, the a pair of the head units 25 are mounted in the openings 41 while the actuator 70 and manifold 71 facing downward.

Two ink cartridges 22 are also mounted next to each other in each head unit 25. With this construction, the four colors of ink including cyan, magenta, yellow, and black are divided two for each head unit 25. Ink supplied from each ink cartridge 22 flows through an independent ink channel in the joint unit 47 and each manifold 71, supplied to the ejection channels 74, and ejected independently from each ejection channel 74.

As shown in FIGS. 3, 5, and 10, the flexible wiring boards 50 are supported along the side walls of the carriage 26. Although not shown in the drawings, the flexible wiring boards 50 is connected to a control circuit provided in a main unit of the printer 21, either directly or via a relay circuit. The flexible wiring board 49 is connected to the flexible wiring board 50 via a relay circuit plate unit 93. Details will be described later.

When ink is supplied to the ink inlet end 76 of each ejection channels 74, the ejection channels 74 change their capacity according to ejection pulse signals received from the flexible wiring board 49. Decreases in capacity cause ink droplets to be ejected from the nozzles 75. Increases in capacity cause ink to be reintroduced into the ejection channels 74. By repeatedly performing these processes, a desired image can be formed on the recording sheet 23.

Next, detailed description will be provided for the ink jet head 24.

As shown in FIGS. 6, 7, 11, 14, and 15, the joint unit 47 includes an upper joint 52 and a lower joint 53 both formed of resin. The upper joint 52 is formed with guides 54, two protrusions 55, pawls 56, and protrusions 86. The guides 54 are protruding upward from the front and rear edges of the upper joint 52 for guiding the ink cartridges 22 when mounting. The protrusions 55 protrude upward from the rear of the upper joint 52 and formed with ink inlets 64 for introducing ink from the ink cartridges 22. Sealing members 57 are provided on each of the protrusions 55 for connecting the protrusions 55 to the supply units 66 of the ink cartridges 22 as shown in FIG. 3

The pawls 56 protrude downward from the front and rear ends of the upper joint 52. The protrusions 86 protrude toward the base plate 46 from the bottom corners of the upper joint 52. The upper joint 52 is further formed, in the bottom surface, with rib-like walls 63A defining a pair of upper channel grooves 61 extending in the direction D2. A triangular protrusion JX is formed on the bottom of the lower channel grooves 62.

Two ink supply cylinders 58 are protruding downward from the front of the lower joint 53. As shown in FIG. 6, the ink supply cylinders 58 are formed with ink supply channels 65. Two lower channel grooves 62 are formed in the top surface of the lower joint 53 corresponding to each wall 63A.

Further, as shown in FIGS. 6 and 7, the upper joint 52 is formed with joining protrusions 59, and the lower joint 53 is formed with joining grooves 60. The joining protrusions 59 are fused in the bottom of the joining grooves 60 by ultrasonic welding. The bottom ends of the walls 63A insert into the lower channel grooves 62. The walls 63A are also welded to the protrusion JX through ultrasonic vibrations, thereby forming an airtight connection between the upper joint 52 and the lower joint 53. As a result, two independent ink channels 63 surrounded by the walls 63A are formed between the two upper channel grooves 61 and the two lower channel grooves 62. One end of each ink channel 63 is in fluid communication with the ink inlet 64 of the protrusion 55, and the other end is in fluid communication with the ink supply channel 65 of the ink supply cylinder 58. The ink inlets 64, the ink channels 63, and the ink supply channels 65 together form two independent ink channels in the joint unit 47.

First filters AF are mounted in the upper joint 52 using the sealing members 57 at the ink inlets 64. Second filters IF are disposed on the lower joint 53 in the ink channels 63 at positions corresponding to the ink supply cylinders 58.

Figure 15:
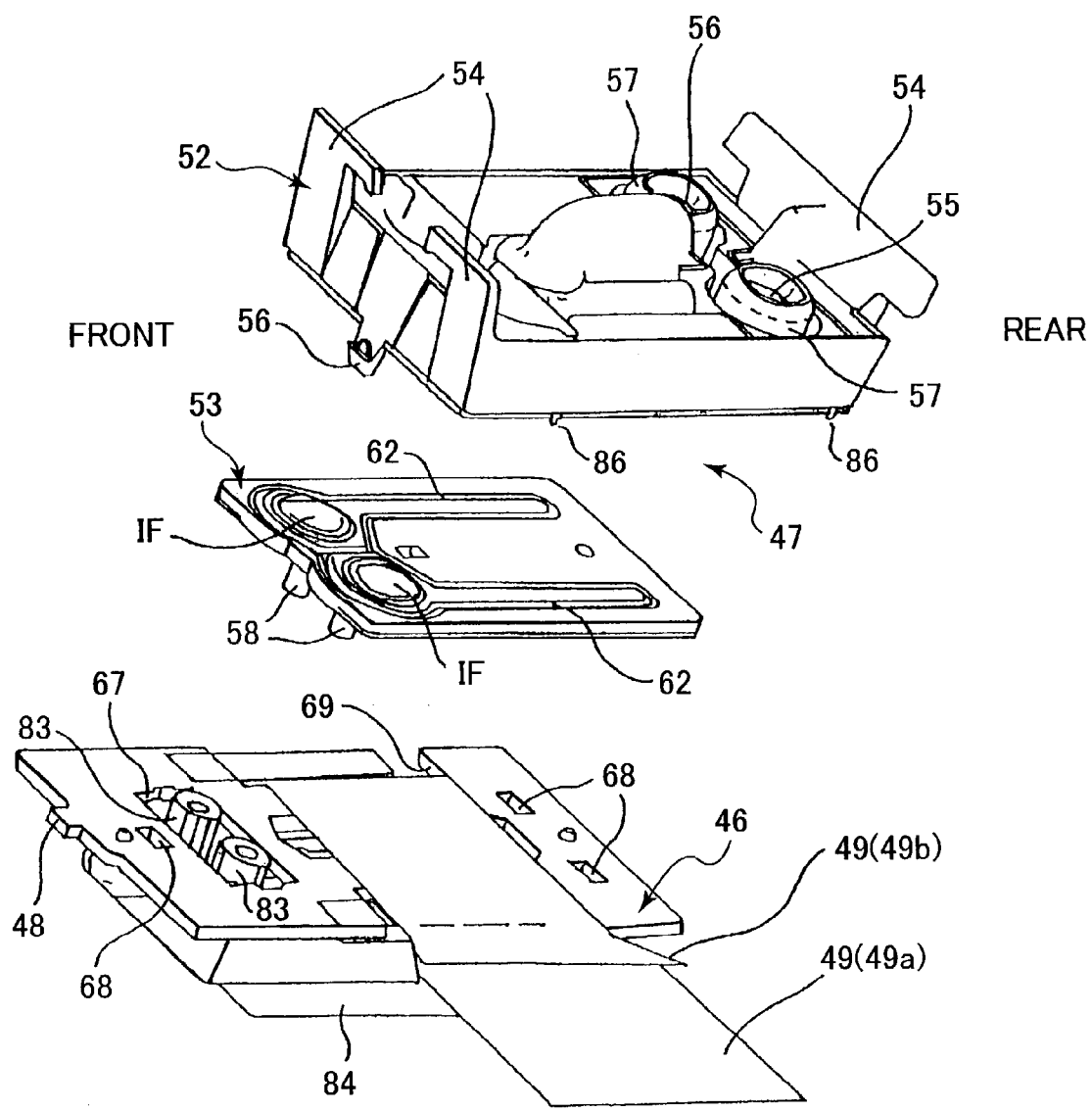
FIG. 15 is an exploded view of the head unit viewed from the above.
Figure 23:
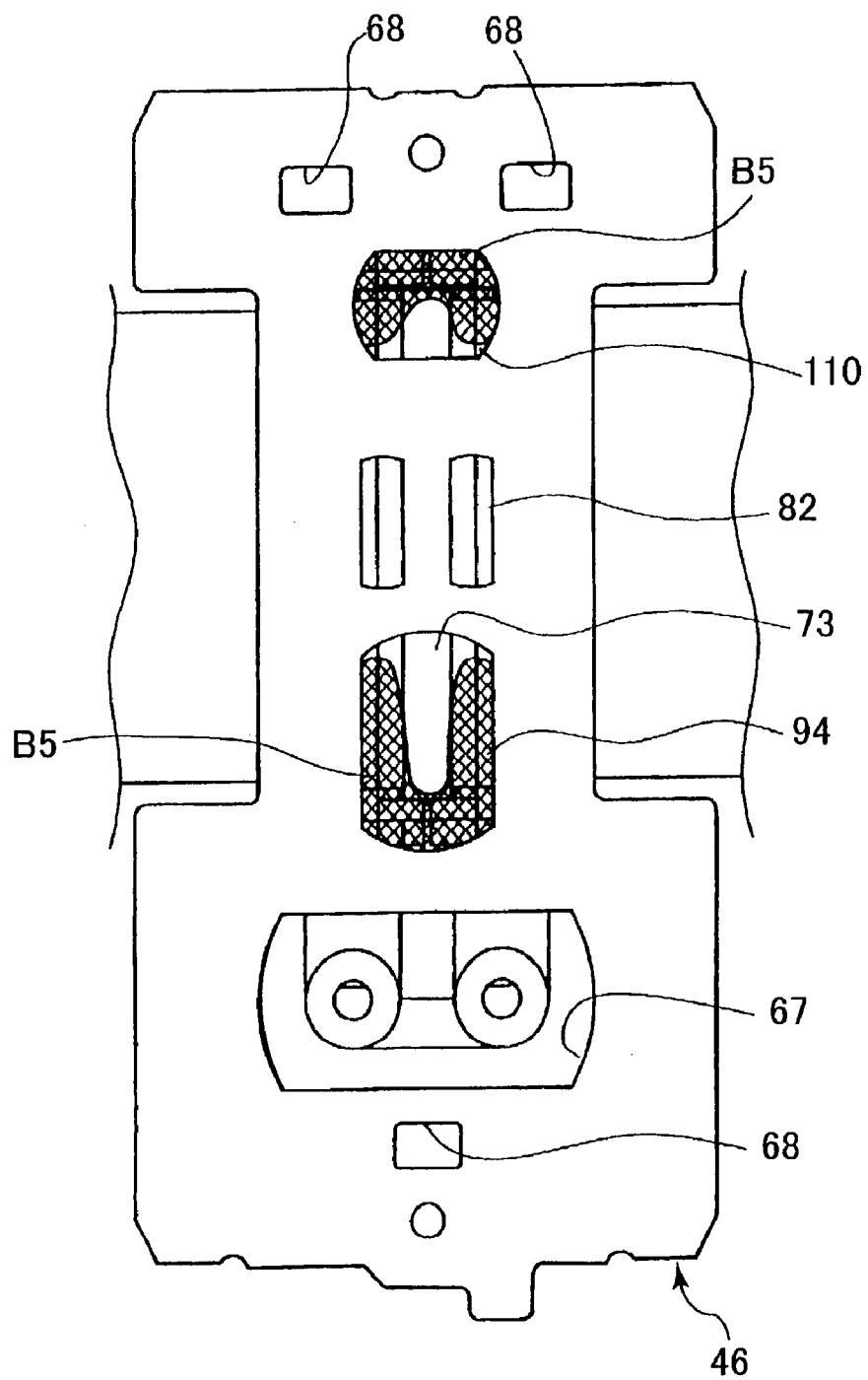
FIG. 23 is an enlarged plan view showing a base plate and the manifold.

The base plate 46 is a rectangular shaped plate formed of a metal material, such as a cold-rolled carbon steel plate (SPCC), having a linear expansion coefficient of in a range of $9.5 \times 10^{-6}/°$ C. to $10.9 \times 10^{-6}/°$ C. As shown in FIGS. 15 and 23, the base plate 46 is formed with a rectangular shaped opening 67, engaging holes 68, an engaging protrusion 48, and openings 82, 94, 110. The opening 67 is formed at a position opposing the ink supply cylinders 58. The engaging holes 68 are formed at positions corresponding to the pawls 56 for engaging the same. The engaging protrusion 48 is formed at the front edge of the base plate 46. The base plate 46 is also formed with a depression 69 in the both sides.

The engaging the pawls 56 on the upper joint 52 are engaged with the engaging holes 68 of the base plate 46, so that the joint unit 47 is detachably and elastically mounted on the base plate 46 by the elasticity of the resin. Because the joint unit 47 is elastically attached to the base plate 46, the engaging parts of the pawls 56 and the engaging holes 68 can absorb the effects of forces and the like from the ink cartridges 22 and the joint unit 47. Accordingly, the manifold 71 and the actuator 70 receive less effects from the ink cartridges 22 and the joint unit 47, thereby effectively preventing positional deviations of the nozzles 75.

Figure 8:
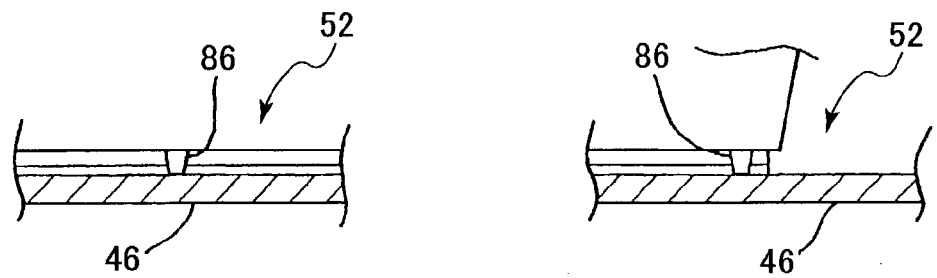
FIG. 8 is an enlarged partial view of FIG. 6.

When the joint unit 47 is attached to the base plate 46 in the above manner, the protrusions 86 formed on the lower joint 53 contact the base plate 46 in a manner shown in FIG. 8. With this arrangement, pressure from the joint unit 47 received by the base plate 46 is dispersed via the protrusions 86. Therefore, the forces from the ink cartridges 22 and the joint unit 47 are distributed and received by the base plate 46. Accordingly, the manifold 71 and the actuator 70 receive even less effects from the ink cartridges 22 and the joint unit 47, thereby more effectively preventing positional deviations of the nozzles 75.

Figure 9:
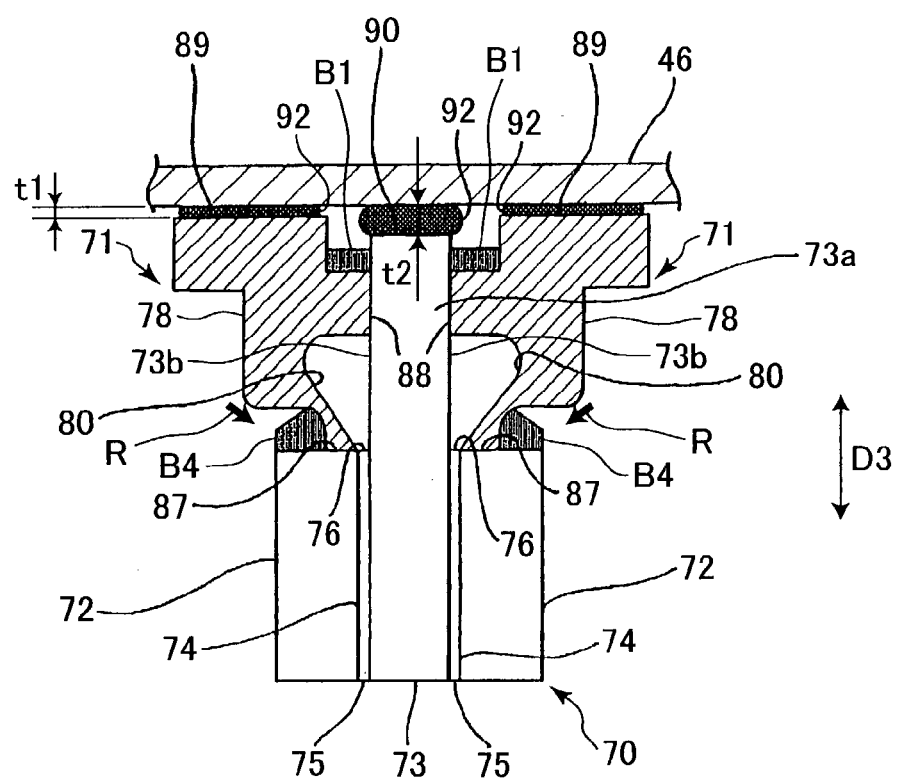
FIG. 9 is an enlarged partial cross-sectional view of the ink jet head.
Figure 16:
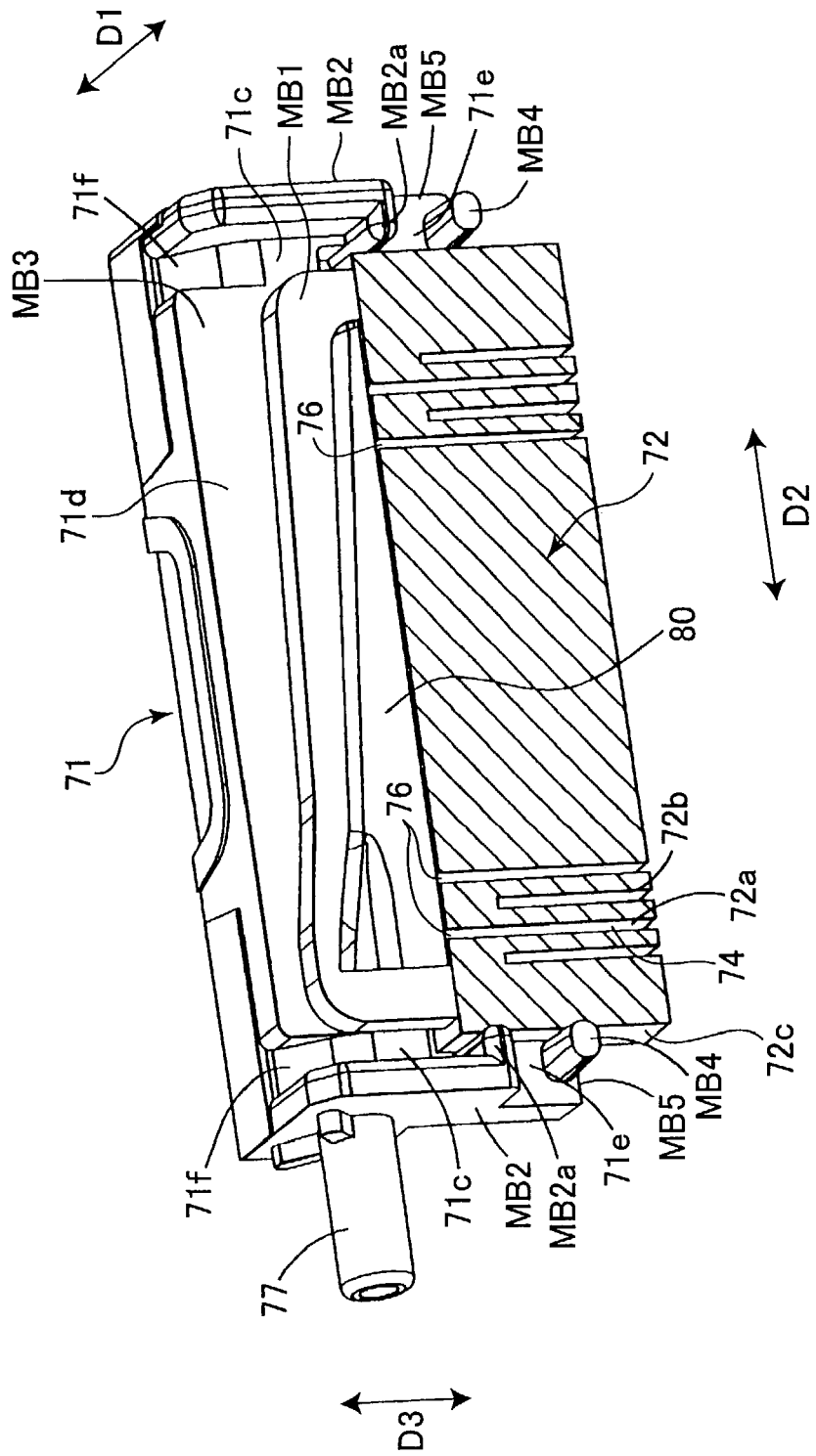
FIG. 16 is an enlarged cross-sectional view showing a manifold mounted on an actuator.
Figure 17:
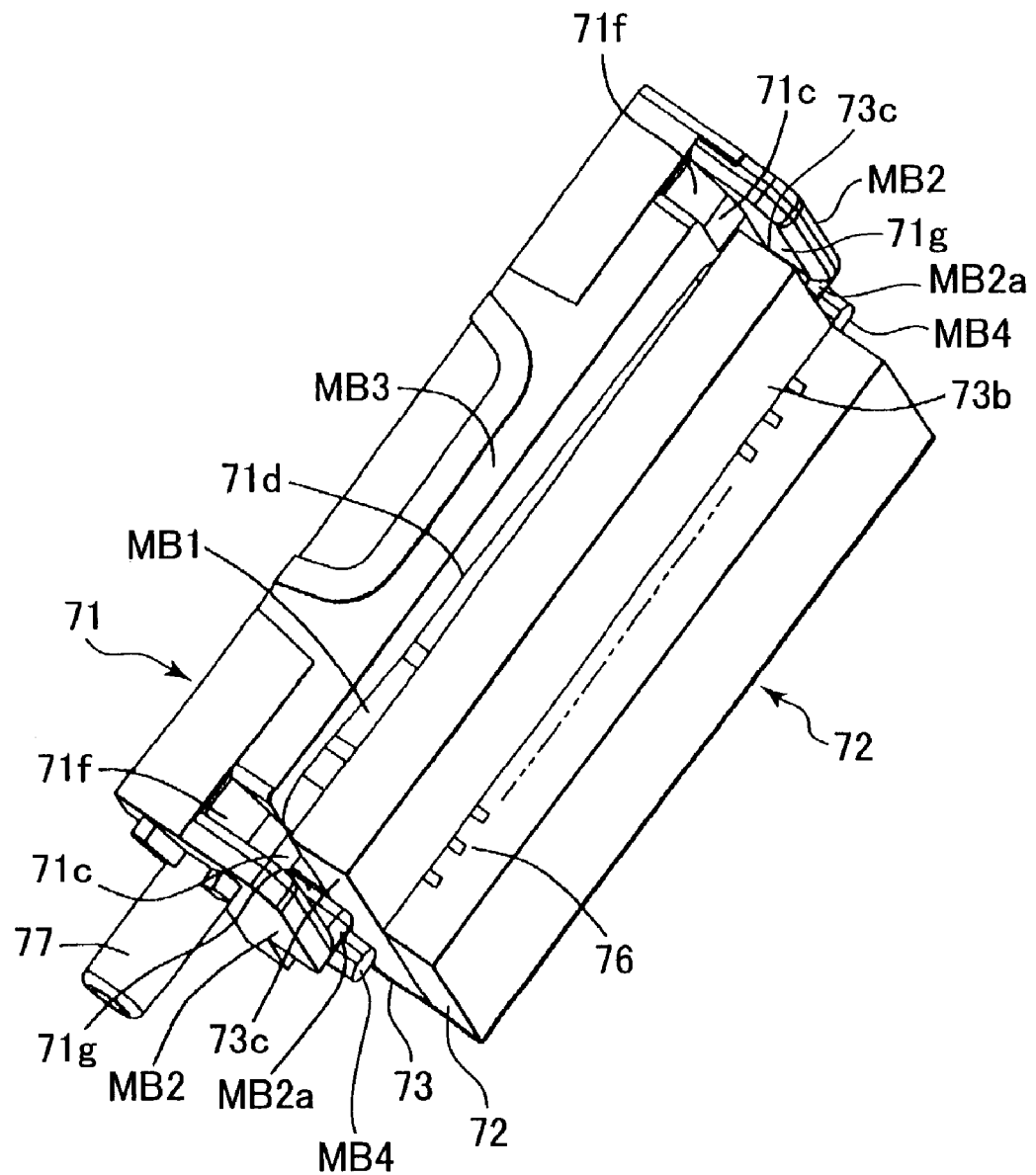
FIG. 17 is an enlarged perspective view showing the manifold joined on only one side of the actuator.

Each channel member 72 of the actuator 70 is rectangular in shape and formed of a deformable material, such as a piezoelectric ceramic, for ejecting ink droplets. As shown in FIGS. 7, 9, and 16, one surface of each channel member 72 is formed with a plurality of ink grooves 72a and a plurality of dummy grooves 72b arranged parallel to one another at prescribed intervals, each extending in the ejection direction D3. For convenience, a portion of the ink grooves 72a and the dummy grooves 72b is enlarged in FIG. 16. The center plate 73 is fixed on the channel members 72 over the ink grooves 72a, thereby defining two opposing rows of the plurality of ejection channels 74 interposed by the center plate 73.

Each of the ejection channels 74 has an ink inlet end 76 on one end, and the other end is in fluid communication with the nozzle 75. The ejection channel 74 is also provided with an electrode (not shown) for ejecting ink droplets from the ink grooves 72a through the nozzle 75 by the work of an ejection energy generating mechanism (not shown).

In this example, the channel members 72 are positioned on both surfaces of the center plate 73. Since this type of piezoelectric ceramic and actuator has been made disclosed in Japanese Patent Application Publication No. HEI-11-286111, a description of these parts will be omitted.

The center plate 73 is formed of a ceramic material, such as forsterite having a linear expansion coefficient of $10.5 \times 10^{-6}/°$ C. The center plate 73 has a rectangular shape with a length longer than the channel members 72 in the direction D3, and protrudes toward the base plate 46 from the ink inlet ends 76 of the ejection channels 74, thereby forming a protruding portion 73a. The protruding portion 73a has a top surface 90 and side surfaces 73b.

The manifold 71 is disposed on top of each channel member 72 and on both sides of the protruding portion 73a. Each manifold 71 has an introducing section 77 and a supply section 78. The introducing section 77 is formed with an introducing channel for introducing ink from the joint unit 47 to the supply section 78, which is disposed over the ink inlet ends 76.

As shown in FIG. 9, the supply section 78 has a bottom surface 87, a side surface 88, and a top surface 89. The bottom surface 87 joins with the top surface of the channel member 72. The side surface 88 joins with the side surface 73b of the protruding portion 73a, and the top surface 89 joins with the lower surface of the base plate 46. The top surface 89 is positioned higher than the top surface 90 of the protruding portion 73a of the center plate 73. As shown in FIG. 16 also, a channel 80 extending in the lengthwise direction D2 is formed between the side surface 73b of the protruding portion 73a and a groove, which is formed between the bottom surface 87 and the side surface 88. The channel 80 is in fluid communication with the introducing channel of the introducing section 77 and the ink inlet ends 76, and distributes the ink into the ejection channels 74.

As shown in FIG. 11, two cylindrical joints 83 are provided between the manifold 71 and the joint unit 47 via the opening 67 of the base plate 46. The joints 83 are formed of an elastic material, such as a rubber or elastomer, and bent into an L-shape. One end 83a of the joints 83 connects to the ink supply cylinders 58 of the lower joint 53, while the other end 83b connects to the introducing section 77 of each manifold 71 via the opening 67 of the base plate 46.

Ink from the ink supply channels 65 of the ink supply cylinder 58 is supplied through the joints 83, the introducing channel of the introducing section 77, into the channels 80, and distributed to the ink inlet ends 76 of the ejection channels 74.

Because the joints 83 are formed from rubber and therefore can absorb the effects of pushing forces from the ink cartridges 22 and the joint unit 47. Accordingly, the manifold 71 and the actuator 70 receive less effects from the ink cartridges 22 and the joint unit 47, thereby more effectively preventing positional deviations of the nozzles 75.

Figure 18:
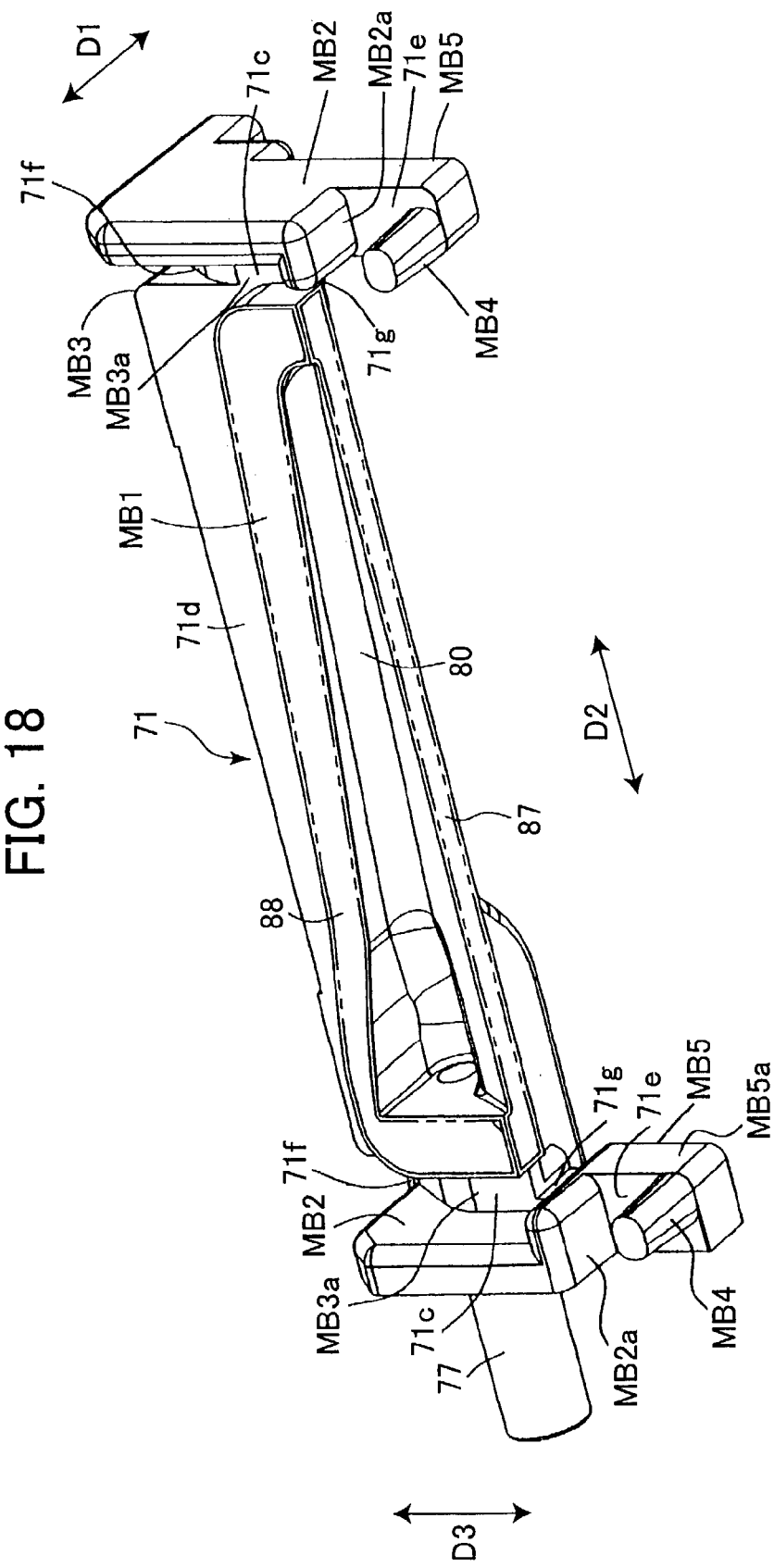
FIG. 18 is an enlarged perspective view of the manifold.

The manifold 71 will be described in further detail. As shown in FIGS. 16 through 19, the manifold 71 is provided with a manifold ink channel wall MB1 that defines the channel 80. As shown in FIG. 18, the width of the channel 80 surrounded by the manifold ink channel wall MB1 is large near the introducing section 77 and grows smaller going away from the introducing section 77.

Figure 19:
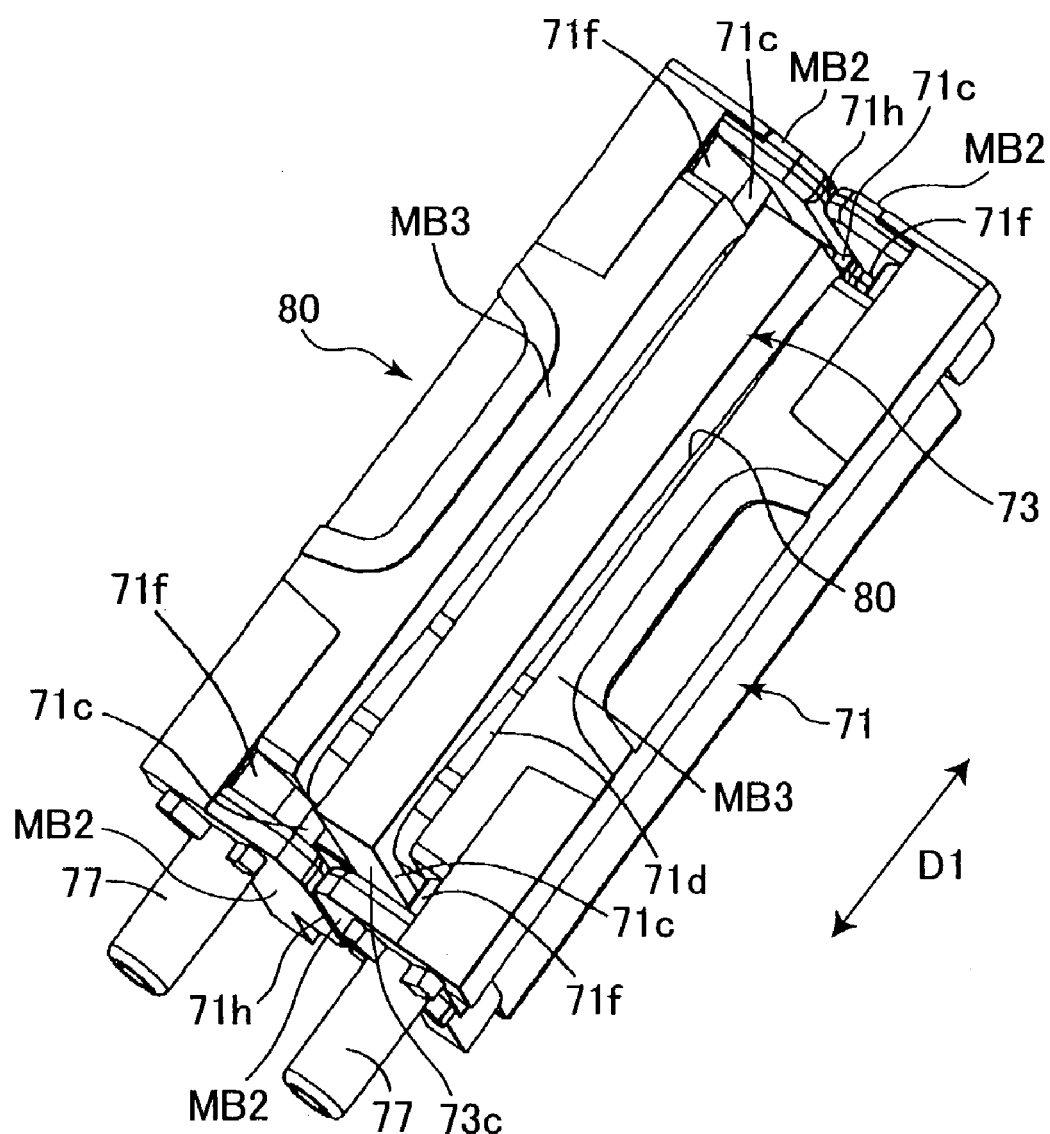
FIG. 19 is an enlarged perspective view showing a pair of manifold joined to the actuator.

The manifold ink channel wall MB1 is formed with protruding part MB3 that protrudes away from the channel members 72, and forms a space 71d between the protruding part MB3 and the protruding portion 73a of the center plate 73. The protruding part MB3 has a part MB3a protruding on both outer ends of the protruding part MB3 in the lengthwise direction D2. A space 71c is formed between the part MB3a and the center plate 73. The part MB3a includes an outer wall MB2 at its end. The outer wall MB2 protrude in the direction D1 to a position in confrontation with a side surface 73c of the center plate 73 as shown in FIG. 19, and also has a length in the direction D2 to confront with the side surface 72c of the channel members 72 as shown in FIG. 16. A protrusion MB2a is provided on the end of the outer wall MB2 to protrude toward the channel members 72 in the direction D2.

The outer wall MB2 is further provided with an extension MB5 extending from the protrusion MB2a along the side surface 72c of the channel members 72. The extension MB5 includes a protrusion MB4 that protrudes parallel to the side surface 73c of the center plate 73 in the direction D1, thereby defining a space 71e between the protrusion MB4 and the protrusion MB2a.

When the manifold 71 is assembled with the actuator 70, the side surface 88 of the manifold ink channel wall MB1 contacts the center plate 73, while the bottom surface 87 contacts the channel members 72, thereby forming the channel 80 in the area surrounded by the two surfaces. A surface MB5a of one of the extensions MB5 contacts the side surface 72c of the channel members 72 to regulate the position of the manifold 71 in the direction D2 that is not regulated by the surfaces 88, 87.

At this time, the space 71c and the space 71d together forms a continuous single space along the contact point between the manifold 71 and the center plate 73 on the outside of the channel 80, into which a sealing agent is introduced. An opening 71f is formed on an upper end of the space 71c, and the protrusion MB2a is positioned at a lower end of the space 71c.

Because the space 71c is defined by the outer wall MB2 and the part MB3a, the size of the space 71c is determined by the size of the part MB3a. Accordingly, the space 71c can be set to an appropriate size for inserting the dispenser to introduce the sealing agent by appropriately setting the size of the outer wall MB2. Also, because the space 71c is in tapered shape to have the enlarged opening 71f greater than the bottom of the space 71c, insertion of the dispenser is further facilitated.

The outer wall MB2 nears the side surface 71c of the center plate 73, but does not actually contact the center plate 73. Therefore, a slit 71g is formed at the bottom end of the space 71c. Accordingly, even if air bubbles are trapped in the space 71c by sealing agent blocking the opening 71f at the time of filling the space 71c with the sealing agent, the air bubbles can still escape out of the space 71c through the slit 71g, enabling the space 71c to be completely filled with the sealing agent. It should be noted that the slit 71g needs not be shaped like a slit. Also, the slit 71g can be positioned in the back of the space 71c near the protrusion MB2a instead.

Figure 20:
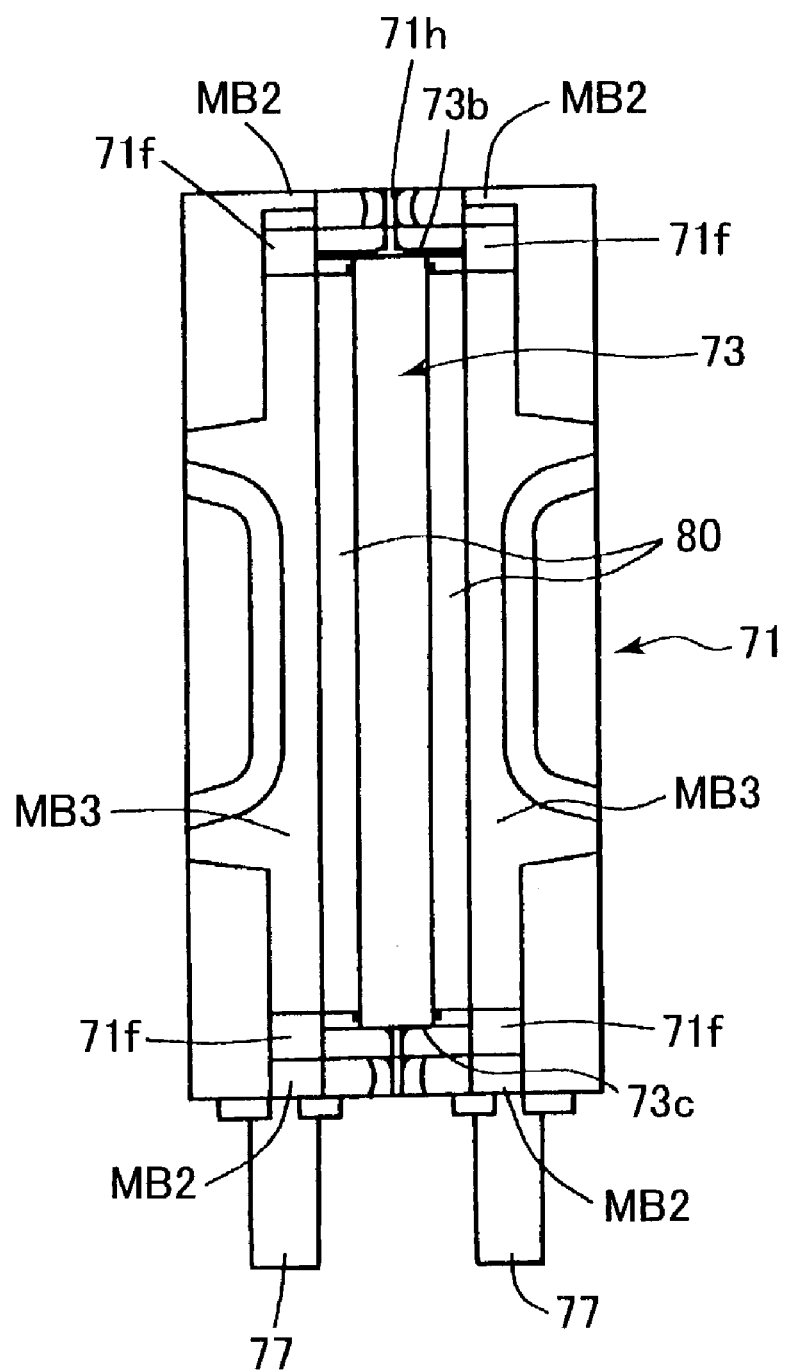
FIG. 20 is an enlarged top view showing the two manifolds joined to the actuator.

As shown in FIGS. 19 and 20, the outer walls MB2 are arranged parallel to the side surface 73c of the center plate 73, opposing each other across a gap 71h, so the air bubbles can escape through the gap 71h without the slit 71g being blocked by the outer wall MB2.

Figure 21:
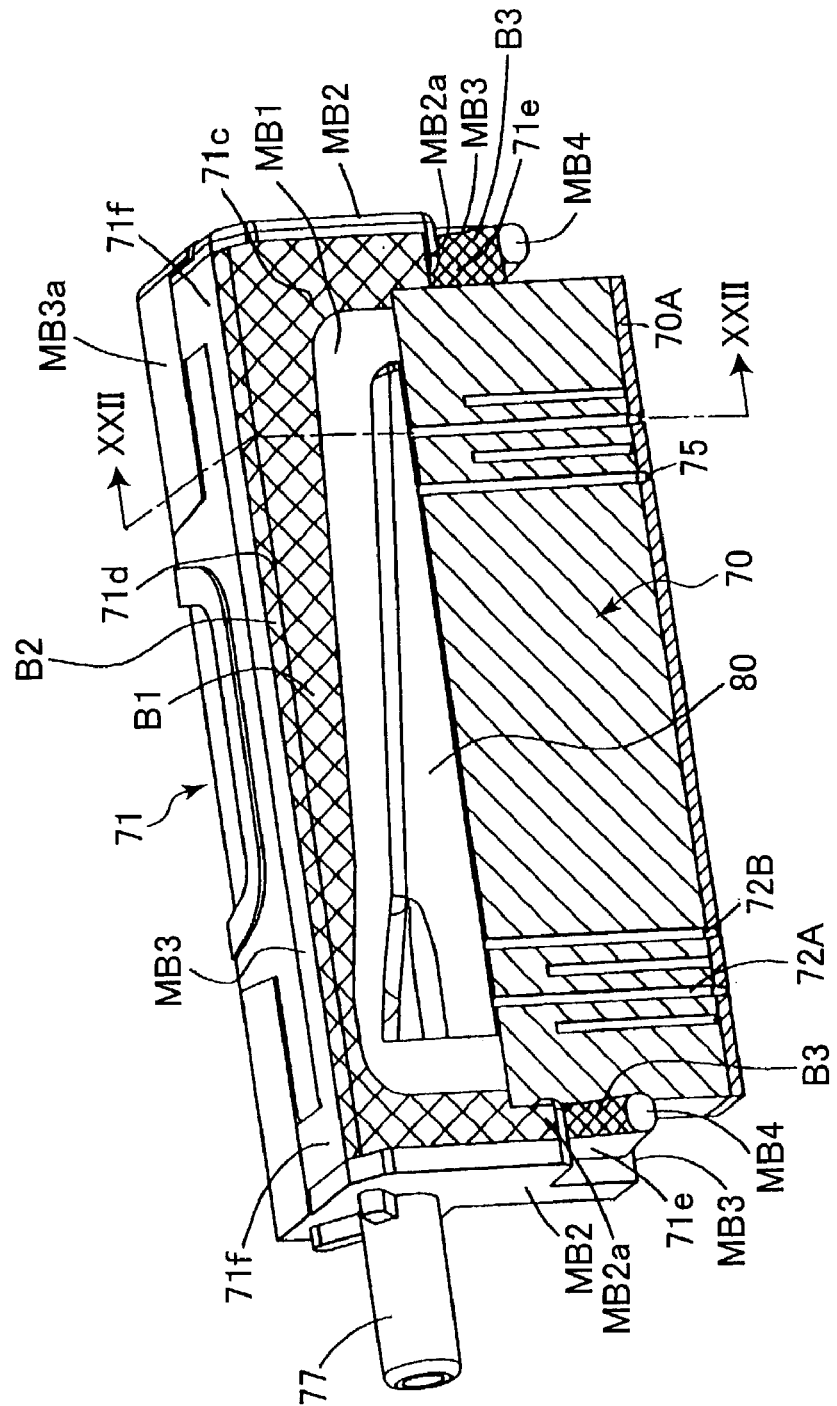
FIG. 21 is an enlarged perspective view illustrating the manufacturing process for the ink jet head with an emphasis on parts applied with sealing agent.

Next, the process for manufacturing the ink jet head 24 of the present embodiment will be described. First, the actuator 70 is formed by joining the pair of channel members 72 to both sides of the center plate 73 using an adhesive. The nozzle plate 70A is fixed to one surface of the actuator 70 using adhesive. Next, the manifold 71 is attached to both end surfaces of the protruding portion 73a in the following manner. As shown in FIG. 21, a UV curing adhesive B3, such as TB3056BB (registered trademark) of Three Bond Co. Ltd., is introduced as a temporary fixing adhesive into the space 71e of each manifold 71. The UV curing adhesive B3 is exposed to ultraviolet radiation to temporarily fix the manifolds 71 to the center plate 73.

Once the manifolds 71 are temporarily fixed in this way, the spaces 71c and 71d are filled with a sealing agent B1 having both a sealing and adhesive effect, while being greatly resistant to ink and having elasticity. An example of this type of sealing agent is a silicon cold-setting type cured at room temperature and humidity, such as KE4897 (registered trademark) of Shinetsu Silicon Inc.

Figure 22:
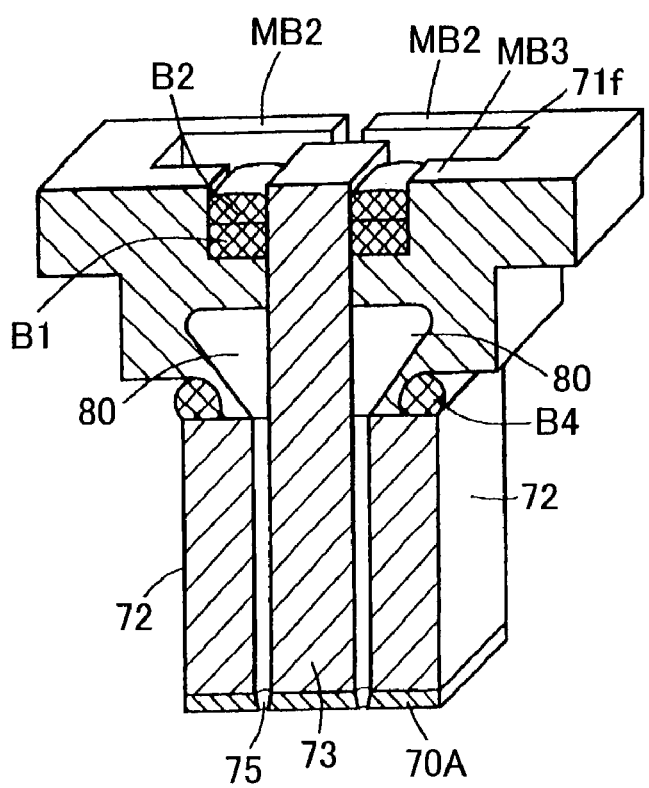
FIG. 22 is a cross-sectional view taken along the line XXII—XXII in FIG. 21.

The areas filled with the silicon sealing agent B1 are indicated by a crossing pattern in FIGS. 21 and 22. The filling operation is performed with the actuator 70 arranged such that the nozzles 75 point downward, that is, the length of the space 71c is oriented vertically. The sealing agent B1 is injected into the space 71c by inserting a thin pipe-shaped dispenser well known in the art into the space 71c. The sealing agent B1 is injected into the space 71d also by moving the dispenser from the space 71c along the space 71d. Even if the sealing agent B1 traps air in the space 71c, the air can escape through the slit 71g as described above. Accordingly, the sealing agent B1 fills the entire space 71c all the way down to the bottom by the force of gravity. Although the spaces 7c are long in the direction D3, the sealing agent B1 is prevented from flowing out of the space 71c by the outer wall MB2. Then, as shown in FIG. 22, a sealing agent B4, which is the same sealing agent as the sealing agent B1, is applied around the contact point between the manifold 71 and the channel members 72, i.e., a position away from a periphery of the channel 80, for sealing these parts.

Further, a sealing agent B2 is applied over the top of the sealing agent B1. The sealing agent B2 is elastic and has both sealing and adhesive properties, but has a lower air permeability than the sealing agent B1. An example of this agent is 31X-038-2 manufactured by Three Bond Co., Ltd. Although the sealing agent B2 is introduced over the entire surface of the sealing agent B1 in this embodiment, it is also possible to first fix the base plate 46 shown in FIG. 23, then introduce the sealing agent B2 in selected portions on the surface of the sealing agent B1 via openings 82, 94, 110.

A high resistance to ink is required for the sealing agent B1, since the sealing agent B1 directly contacts ink that might leak through gaps in the contact areas between the manifold 71 and the center plate 73 or the channel members 72. Since the base plate 46 and the center plate 73 and the base plate 46 and the manifold 71 are fixed together by a hot-setting epoxy resin and are therefore exposed to a high-temperature environment, the sealing agent B1 also requires elasticity for preventing deformation or cracks from generating due to the difference in linear expansion coefficients in the manifold 71, the center plate 73, and the channel members 72.

As an example, the manifold 71 is formed of a compound resin material having a linear expansion coefficient of $90 \times 10^{-6}/°$ C. when using a PBT/ABS resin, the center plate 73 is formed of a ceramic material, such as forsterite having a linear expansion coefficient of $10.5 \times 10^{-6}/°$ C., and the channel members 72 are formed of a piezoelectric ceramic material having a linear expansion coefficient in a range of $1 \times 10^{-6}/°$ C. to $4 \times 10^{-6}/°$ C. If the cured sealing agent B1 has sufficient elasticity to absorb deformations in components at required temperatures, the sealing capacity is not lost, enabling the use of one-component hot-setting resins, such as epoxy resins, superior in adhesive strength and resistance to positional deviations and providing the apparatus a capacity to deal with changes in ambient temperatures.

Although the sealing agent B1 is satisfactory for the above conditions, the air permeability of the sealing agent B1 is higher than that of the sealing agent B2. Tiny air bubbles generated in ink within the channel 80 and the ejection channels 74 rise upward and become deposited on the ceiling of the channel 80. If small amounts of external air pass through the sealing agent B1 and enter through gaps between the manifold 71 and the center plate 73 or the channel members 72, air bubbles can easily grow and become trapped in the channel 80 and the ejection channels 74, causing ejection problems.

To prevent this, the sealing agent B2 having a lower air permeability than the sealing agent B1 is applied over the top of the sealing agent B1 such that the sealing agent B1 is positioned between the channel 80 and the sealing agent B2. Although the sealing agent B2 can be applied over the entire top of the sealing agent B1, it is effective to apply the sealing agent B2 on the area above the channel 80 since air bubbles in the ink collect on the ceiling of the channel 80. The sealing agent B2 applied on the area above the channel 80 prevents the air bubbles one the ceiling of the channel 80 from growing. Since the sealing agent B2 does not come into contact with the ink, its resistance to ink can be less than that of the sealing agent B1.

As described above, when the center plate 73 and the manifolds 71 are assembled together, the sealing agent B1 having a high resistance to ink and elasticity is applied on the channel 80 side of the space 71d, and the sealing agent B2 having low air permeability is also applied onto the sealing agent B1 on the side opposite the channel 80 side. In this way, the area to be sealed is provided with elasticity to prevent deformations caused by temperature changes and high resistivity to ink. This configuration also prevents the growth of air bubbles in ink by restraining air from entering into the manifold ink channels, thereby reducing problems in ink ejection.

Although this example describes the sealing agent B2 having the same elasticity as the sealing agent B1, its elasticity can be less than that of the sealing agent B1 since the sealing agent B1 is interposed between the manifold 71 and the center plate 73.

Next, the flexible wiring board 49 is attached to the channel members 72 by a soldering process or the like. By applying adhesive between the flexible wiring board 49 and the manifold 71 farther toward the free end than the part to be soldered to place the flexible wiring board 49 onto the manifold 71, problems of soldering coming undone can be avoided. Subsequently, the manifold 71 and the center plate 73 are joined to the base plate 46 using a hot-setting epoxy adhesive.

Then, the actuator 70 and the manifold 71 are fixed onto the base plate 46 in a manner described below. As shown in FIG. 9, an epoxy adhesive 92 is applied by a dispenser to the lengthwise center of the top surface 90 of the protruding portion 73a and the lengthwise center of the top surfaces 89 of the supply sections 78. Using a jig, the top surface 90 and the top surfaces 89 are placed on the lower surface of the base plate 46, which is opposite the upper surface on which the joint unit 47 is mounted. This arrangement forms gaps t1 between the top surface 89 and the base plate 46 that are smaller than a gap t2 between the top surface 90 and the base plate 46. A UV-curing adhesive B5 is applied around the openings 94 and 110, as shown in FIG. 23. After temporarily fixing the components with UV adhesive, the jig is removed. Subsequently, the ambient air is raised to the curing temperature of the epoxy adhesive so that the adhesive 92 and B5 are cured by heat. As a result, the top surface 90 and the base plate 46 and the top surface 89 and the base plate 46 are fixed together by the epoxy adhesive 92. Hence, the actuator 70 is directly fixed to the base plate 46, while the manifold 71 is also directly fixed to the base plate 46.

If the UV-curing adhesive B5 has a sealing effect and a low air permeability, the UV-curing adhesive B5 can be applied over the top of the sealing agent B1 on areas shown in FIGS. 21 and 22, and the sealing agent B2 can be omitted.

Because the gap t1 is set smaller than the gap t2, the epoxy adhesive 92 used in the larger gap t2 contracts more during curing than the epoxy adhesive 92 in the gaps t1. Accordingly, the center plate 73 is pulled with more force by the adhesive 92 toward the base plate 46 than the manifold 71. By being disposed between the base plate 46 and the channel members 72, the manifold 71 constantly applies an elastic urging force to the channel members 72. The direction of the urging force is indicated by arrows by R in FIG. 9. As a result, the manifold 71 and the actuator 70 are reliably fixed together, preventing positional deviations between the two from occurring in processes following assembly of the ink jet head 24 even when heat and external forces are applied. Therefore, this construction can prevent the generation of air bubbles when using the color ink jet printer 21 that can cause positional deviation between the manifold 71 and the actuator 70, thereby effectively preventing problems in ink ejection occurring after the printer 21 has been at rest. Since the manifold 71 and the channel members 72 are disposed on both sides of the center plate 73, force from the manifold 71 centers on the center plate 73 and is well balanced between each channel member 72. Accordingly, the manifold 71 and the channel members 72 are more reliably fixed together, thereby more effectively preventing positional deviation between the two.

The adhesive 92 used to fix the base plate 46 and the manifold 71 is not limited to the epoxy adhesive 92. However, the amount of shrinkage in curing is preferably in a range of 1% through 10%, and optimally around 3%. The gap t2 may be 0.75 mm, and the gap t1 may be in a range of 0.22 mm to 0.33 mm, for example. The ratio t2/t1 is determined depending on the hardening shrinkage of the adhesive being used. However, it is preferable that the ratio t2/t1 be in a range of 2 to 10 when the hardening shrinkage is approximately 3%. It should be noted that when this hardening shrinkage becomes too large, warping in the adhesive may become great and affect the strength of the adhesive itself.

Because the center plate 73 is firmly and directly fixed to the base plate 46 by the epoxy adhesive 92, the nozzles 75 of the actuator 70 are directly positioned and maintained by the base plate 46 at all times without relation to the junction between the actuator 70 and the manifold 71. Therefore, forces applied to the manifold 71 from other members, such as from the actuator 70 and the manifold 71 when joining these components or from the protecting cap 37 of the purging device 29 during purge operations or when the color ink jet printer 21 is not in use, will not cause substantial positional deviations in the nozzles 75, thereby attaining satisfactory printing quality.

Also, because center plate 73 is formed from forsterite at a linear expansion coefficient of $10.5 \times 10^{-6}/°$ C. while the base plate 46 is composed of the SPCC having a linear expansion coefficient of in a range of $9.5 \times 10^{-6}/°$ C. to $10.9 \times 10^{-6}/°$ C., the linear expansion coefficients for the top surface 90 and the bottom surface of the base plate 46 are substantially equivalent. Accordingly, only little peeling, cracking, or the like will be generated between these two components by changes in heat, for example, thereby effectively preventing such peeling or cracking that can cause positional deviations of the nozzles 75.

By making the linear expansion coefficient substantially equal as described above, these two components can be fixed together using a one-component hot-setting epoxy adhesive 92. This type of adhesive has a longer pot life with a shorter curing time than a two-component cold-setting epoxy adhesive, thereby improving workability.

Moreover, the actuator 70 and the manifold 71 are fixed to the base plate 46 only in the lengthwise center part of the top surface 90 of the center plate 73. Therefore, warping or the like occurring between the head holder 2 from changes in temperature due to a difference, albeit slight, in the linear expansion coefficient can be tolerated by parts of these components outside the lengthwise center part of the top surface 90. Accordingly, this construction effectively prevents cracks that can be generated from warping and the like.

The base plate 46 is interposed between the joint unit 47 in which the ink cartridges 22 are mounted and the manifold 71 and the actuator 70. Accordingly, the amount of force from the ink cartridges 22 and the joint unit 47 received by the actuator 70 is further reduced, and positioning of the actuator 70 is determined solely by the base plate 46. Therefore, the position of the nozzles 75 in the actuator 70 is also determined only by the base plate 46, thereby further reducing deviations in position and achieving a satisfactory printing quality.

Since the top surface 90 of the center plate 73 is affixed to the base plate 46 and the manifolds 71 are disposed on the sides of the center plate 73 between the base plate 46 and channel members 72, the actuator 70 can be reliably fixed to the base plate 46 according to a simple construction, while reliably enabling ink to be supplied from the manifold 71 to the actuator 70.

It should be noted that although the linear expansion coefficient of the top surface 90 and the bottom surface of the base plate 46 are preferably be substantially equivalent as described above, this range of substantial equivalence is not related to absolute values, but rather is the range of both linear expansion coefficients in which no peeling or cracking occurs between the two by changes in temperature. For example, one coefficient may have a range approximately three times the other.

The manufacturing of the joint unit 47 is performed simultaneously. Specifically, the first and second filters AF and IF are mounted in the ink channels 63 at the upper joint 52 and the lower 53, respectively. Then, the lower joint unit 53 is mounted on the upper joint unit 52. Since both the lower joint unit 53 and the upper joint unit 53 are formed of a compound resin such as ABS, an ultrasonic welding method or the like can be used.

Figure 36:
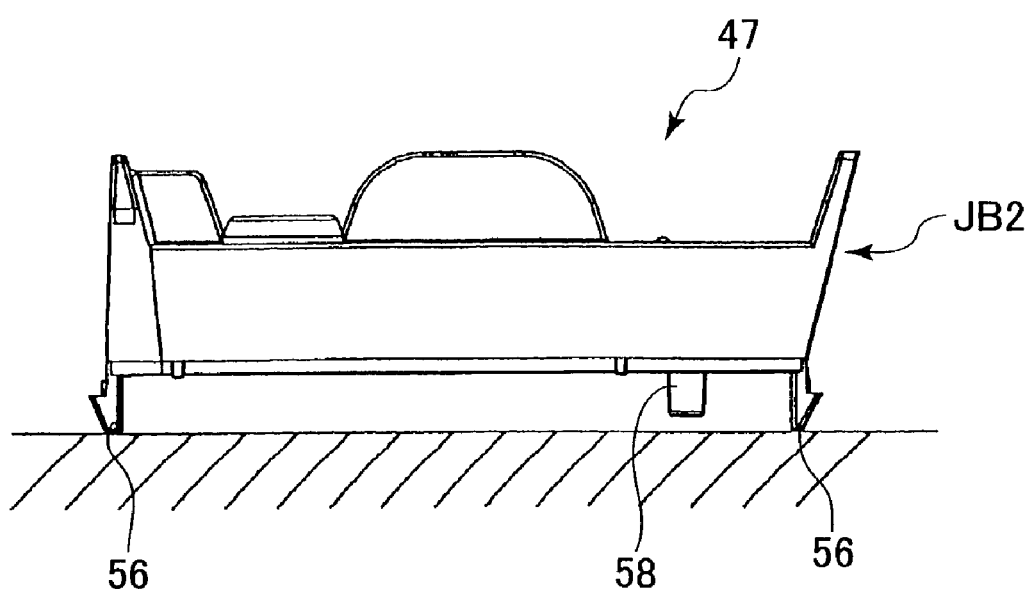
FIG. 36 is a front view showing the joint unit resting on a working table.

As shown in FIG. 36, the pawls 56A and 56B are preferably longer than the ink supply cylinders 58 to prevent the ink supply cylinders 58 from touching a surface of a working table or the like and from becoming soiled when placed on the working table.

Then, the introducing sections 77 of the manifolds 71 are connected to the ink supply cylinders 58 of the joint unit 47 by the joints 83, and the pawls 56 are inserted and engaged into the engaging holes 68.

When the head unit 25 is mounted to the carriage 26, the engaging protrusion 48 of the base plate 46 is received into the engaging groove 44, and the rear and side edges of the base plate 46 are brought into contact with the leaf springs 45a and 45b. The urging force of the leaf springs 45a and 45b push the base plate 46 into the engaging members 43a and 43b and the bottom wall 42. In this way, the reference position of the ink jet head 24 is determined by the base plate 46.

Since the actuator 70 and the manifold 71 and the base plate 46 are integrally attached to the carriage 26 in the above manner, the positions of the actuator 70 and the manifold 71 are also fixed to a reference position along with the base plate 46.

Then, the ink cartridges 22 are mounted on the head unit 25. During installation, the ink cartridges 22 are guided along the guides 54. The supply units 66 of the ink cartridges 22 are connected to the protrusions 55 via the sealing members 57.

Next, configurations of the first and second filters AF, IF and surrounding components will be described.

The first filter AF is fixed by heat welding or adhesive to the top of the protrusions 55 on the upper joint 52 for covering the inlets 64. The pores of the first filter AF are of a sufficient size to prevent ink from leaking by the surface tension in the ink meniscus. The sealing member 57 formed of an elastic material, such as rubber, 10 further covers the protrusions 55. Although the ink cartridges 22 are detachably connected to the sealing member 57 for supplying ink, the ink cartridges 22 may be connected to the sealing member 57 by a tube extending from the ink tank.

The first filter AF has pores with a sufficient size such that the surface tension of the ink meniscus prevents ink leaking from the nozzles 75. Specifically, the first filter is AF is formed by sintering or weaving stainless steel fibers to have the pores with a filtration precision of between 20 μm to 300 μm. When the first filter AF is formed by twill-tatami-weave, the filtration precision is preferably about 50 μm, forming a mesh with 120 (L)×400 (W) pores per inch and having a diameter of 0.100 mm (lengthwise fibers)×0.063 mm (widthwise fibers). The first filter AF has an effective surface area of about 3.14 mm$^2$.

Alternatively, the first filter AF can be formed from a plain-tatami-weave stainless steel mesh having a filtration precision of about 70 μm. In this case, the stainless steel mesh has 40 (L)×200 (W) pores per inch and the diameter of 0.180 mm (lengthwise fibers)×0.014 mm (widthwise fibers).

The first filter AF with this construction has an effective surface area and sufficient pores to maintain sufficient ink supply when performing repeated ink ejection from all ejection channels 74 in the actuator 70 or when the protecting cap 37 of the purging device 29 is placed over the nozzles 75 to extract ink from the nozzles 75 in the purging operation well known in the art. Further, the pores are at a size sufficient for preventing ink from leaking. More specifically, the pores are of a size capable of retaining the ink meniscus formed therein that resists the ink pressure of the water head difference H (see FIG. 6) between the first filter AF and the nozzles 75.

As is well known in the art, ordinarily ink in the head unit 25 is maintained at a negative pressure by a negative pressure generator, such as porous foam, in the ink cartridge 22. Therefore, if the meniscus of ink in the nozzles 75 is broken due to ink deposited around the nozzles 75, the ink will still not leak out of the nozzles 75. When the ink cartridge 22 is removed from the head unit 25, exposing the inlets 64 to air, ink in the head unit 25 will still not flow from the nozzles 75 even when the ink meniscus is broken, provided the first filter AF has the pores described above. Therefore, the ink meniscus formed in the first filter AF holds the ink between the ink channels 63 and the nozzles 75 against the water head difference H even when atmospheric pressure works on the ink inlets 64 when the ink cartridges 22 are removed. Ink does not flow out of the nozzles 75 even if the meniscus in the nozzles 75 breaks.

Further, ink does not leak out of the ink channels 63 when the head unit 25 is removed from the carriage 26 for repairs or the like and when the ink cartridges 22 are removed from the head unit 25, even if the 25 is tilted or knocked over. This is due to the surface tension in the meniscus of ink spread on the filter AF.

Figure 24A:
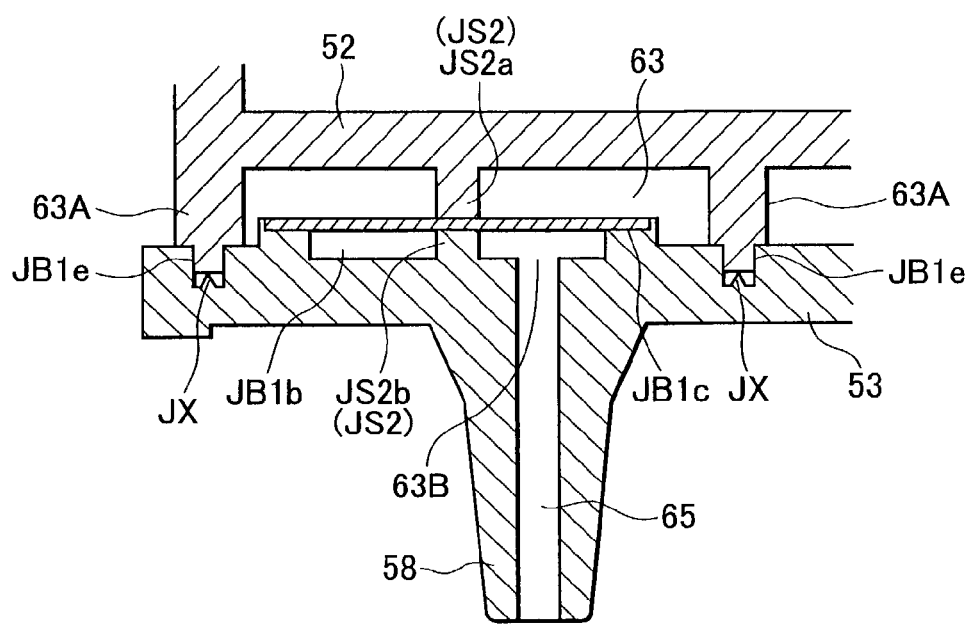
FIG. 24(a) is a cross-sectional view showing a filter attached to the joint unit having a joint unit.

As shown in FIG. 24(a), a depression JB1b is formed in the lower joint 53 and has an outlet port 63B that is in fluid communication with the ink supply channels 65. The depression JB1b has a diameter that is greater than that of the ink supply channels 65 and sufficient to maintain the effective area required for the second filter IF.

The ink channels 63 have a prescribed width and extend linearly from the ink inlets 64 to the depression JB1b, but expand circularly in a larger diameter at an area surrounding the depression JB1b. The shape of the ink channels 63 can be clearly seen from the shape of the rib-like walls 63A forming the contours of the upper channel grooves 61 shown in FIG. 11.

An annular wall JB1c (circumferential support) surrounds the depressions 53A in the lower joint 53. The second filter IF is fixed to the top of the annular wall JB1c, covering the depressions 53A for removing foreign matter, air bubbles, and the like that can cause problems in ink ejection. The diameter of the second filter IF is set smaller than the diameter of the nozzles 75.

More specifically, the second filter IF is placed over the top of the annular wall JB1c and the periphery of the second filter IF is fixed to the annular wall JB1c by heat welding or adhesive such that the second filter IF is provided in each of the ink channels 63 upstream from the ink supply channels 65. The center portion of the second filter IF is supported on or fixed to a center support JS2. The center support JS2 includes an upstream protrusion JS2a protruding from the ceiling of the upper joint 52, and a downstream protrusion JS2b protruding from the bottom of the depression JB1b. Hence, the center support JS2 contacts both surfaces of the second filter IF upstream and downstream.

The second filter IF is formed by sintering or weaving stainless steel fibers, such that the filtration precision of the pores is less than about 20 μm, which is superior to the first filter AF in filtration precision. The second filter IF is preferably formed with a filtration precision of about 10 μm when formed by twill-tatami-weave. Specifically, the second filter IF have 270 ( )×2,000 (W) pores per inch, and the stainless steel fibers in the lengthwise direction have a diameter of 0.040 mm and that in the widthwise direction have a diameter of 0.026 mm. The second filter IF is formed with an effective surface area of about 16.6 mm$^2$. Accordingly, the second filter IF has a larger effective surface area than the first filter AF.

The second filter IF removes foreign matter sufficiently smaller than the diameter of the ejection channels 74 and the nozzles 75. Also, because the second filter is mounted downstream from the first filter AF, the second filter IF can remove foreign matter, which has been introduced through the first filter AF, from entering the actuator 70, thereby maintaining sufficient printing quality without problems in ink ejection.

Because the second filter IF has the better filtration precision than the first filter AF, the second filter If has a large pressure loss per unit area than the first filter AF. In order to avoid insufficient ink supply due to the pressure loss, the second filter IF is formed to have a sufficient effective surface area. Accordingly, sufficient ink can be supplied during repeated ink ejections and during a suction operation by the purging device 29. Also, because the second filter IF has a relatively large effective surface area, the second filter IF can maintain sufficient levels of ink supply even when small amounts of foreign matter are deposited in the pores of the second filter IF.

During the assembly, the lower joint 53 is fixed to the upper joint 52 through ultrasonic welding after fixing the second filter IF to the lower joint 53. During the ultrasonic welding process, the center support JS2 restrains vibrations in the center portion of the second filter IF caused by ultrasonic waves. Without providing the center support JS2, the vibrations generated in the center of the second filter IF could cause the second filter IF to peel from the annular wall JB1c or become deformed. If the second filter IF deforms enough to contact the ceiling surface of the ink channels 63 or the bottom surface of the depression JB1b, the effective surface area of the second filter IF is reduced. The effectiveness of the second filter IF is more remarkable with a larger surface area. The present invention can maintain the functions of the filter with a high reliability and secure the required amount of ink supply by preventing this problem. When fixing the lower joint 53 and the upper joint 52 through ultrasonic welding, the upstream protrusion JS2a and the downstream protrusion JS2b are also welded to the second filter IF.

Since the center support JS2 can most effectively restrain vibrations in the second filter IF when contacting the center thereof, the downstream protrusion JS2b should be provided in the center of the depression JB1b. With this construction, the ink supply channels 65 will be positioned off-center in the depression JB1b.

It should be noted that one or a plurality of the center support JS2 can be provided near the center of the second filter IF and need not be positioned directly in the center. The center support JS2 also does not need to contact the second filter IF on both surfaces, but can simply contact the second filter IF on one surface. The second filter IF can also be separated from the center support JS2 when the second filter IF is placed on the annular wall JB1c.

Figure 24B:
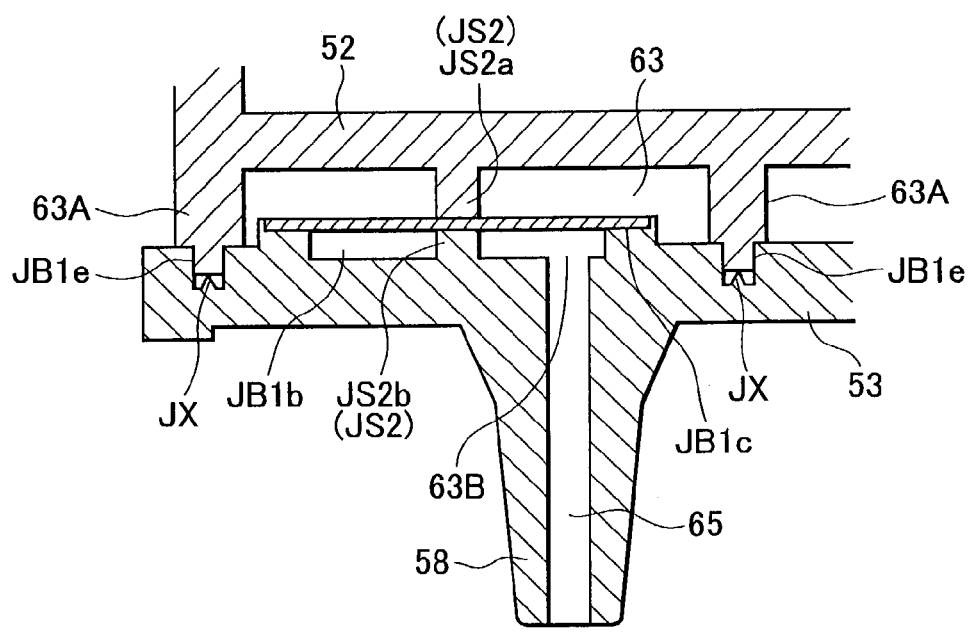
FIG. 24(b) is a cross-sectional view of a modified filter.

It should be noted that when the distance between the annular wall JB1c and the center support JS2 is large, the ink supply channels 65 can be disposed off-center between the two as shown in FIG. 24(b), so that the ink supply channel 65 is not blocked when the filter IF vibrates during ultrasonic welding.

Figure 25:
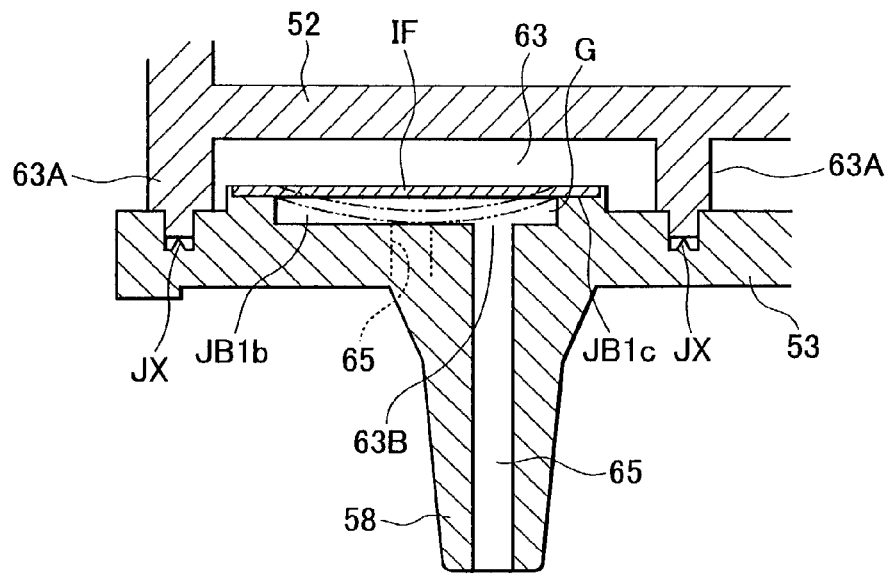
FIG. 25 is a cross-sectional view showing a filter attached to a joint unit without a center support.

FIG. 25 shows a modification of the embodiment where the center support JS2 has been omitted. The ink supply channels 65 is provided off-center in the depression JB1b in the lateral direction. Further, the second filter IF is fixed to the depression JB1b providing a filtering surface in the depression JB1b.

As described above, the second filter IF vibrates when fixing the upper joint 52 and the lower joint 53 with ultrasonic welding, and the center of the filter IF can contact the bottom surface of the annular wall JB1c during the welding process as indicated by the dotted line. However, because the second filter IF is disposed off-center in the depression JB1b, a gap G is formed between the opening of the ink supply channels 65 and most of the surface of the second filter IF, and so a sufficient filter surface area for supplying ink to the ink supply channels 65 can be secured. The second filter IF have an extra surface area to make up for the amount of surface area expected to be welded to the bottom surface of the depression JB1b.

It should be noted that if the ink supply channels 65a is formed in the center of the depression JB1b as shown by the dotted line rather than off-centered, the second filter IF would be welded over the outlet port 63B that is an inlet port of the ink supply channels 65. In this case, ink can only flow through the part of the second filter IF corresponding to the inlet port of the ink supply channels 65. In other words, the surface area of the second filter IF becomes extremely small, resulting in an insufficient supply of ink.

As described above, the upper joint 52 and the lower joint 53 extend in the direction D2 parallel to the ink channels 63, and are joined together in the direction D3 orthogonal to the ink channels 63. Further, the second filter IF is mounted on the lower joint 53 and is oriented parallel to the ink channels 63. Hence, the head unit 25 can be made flatter and more compact even when increasing the surface area of the second filter IF to supply a large amount of ink even after removing foreign matter.

By positioning the second filter IF on the surface of the lower joint 53, the second filter IF can easily maintain a sufficient ink supply level and a large enough surface area even when foreign matter becomes deposited thereon. The first filter AF, on the other hand, can have a relatively small surface area, providing the pores are sufficient to achieve the surface tension described above. As a result, the protrusions 55 and the sealing members 57 can be made relatively small, making it easy to form a seal with the ink cartridges 22.

Ink supplied from the ink cartridges 22 passes through the first filters AF in the joint unit 47 and is introduced into the ink channels 63 via the ink supply channels 65. The ink passes through the second filter IF and is supplied to the manifold 71 via the ink supply channels 65.

It should be noted that it is conceivable to omit the first filter AF and to provide the second filter IF to the position of the first filter AF. However, this configuration requires the sealing members 57 having a larger size. It is difficult to secure the sealing effect of such sealing members. This may result in ink leakage and allow an air entering into the ink inlets 64 from outside. The air generates air bubbles in ink and prevents proper ink ejection.

Water ejection tests are conducted on the head unit 25 having the above configuration to check whether ink is ejected properly. When the nozzles 75 are clogged with foreign matter, the joint unit 47 is removed from the base plate 46 along with the second filters IF and the first filters AF, and water is introduced through the nozzles 75. As a result, the foreign matter is removed from the nozzles 75 through the introducing section 77. Therefore, if the head unit 25 fails the water ejection test, it is possible to restore proper ejection and to reuse instead of dispose of the head unit 25. Moreover, this cleaning operation can be performed while the manifold 71 and the actuator 70 are still fixed to the base plate 46 at a reference position. Therefore, the actuator 70 and the manifold 71 are constantly fixed with no effect on the reference position, facilitating their attachment to the carriage 26.

By forming the pawls 56 on the joint unit 47 and the engaging holes 68 on the base plate 46, the joint unit 47 and the base plate 46 can be easily detached and reattached by engaging and disengaging the pawls 56 and engaging holes 68. Since the configuration of the joint unit 47 is made unrelated to the determination of the reference positions of the manifold 71 and the actuator 70, a simple attaching and detaching construction can be achieved by engaging and disengaging the pawls 56 and the engaging holes 68.

The joint unit 47 is easily attached and detached by attaching or detaching the joints 83 from the joint unit 47 or the manifold 71. Moreover, by forming the joints 83 of a flexible material, the joints 83 can be easily attached and detached to further improve ease of operations.

By forming the guides 54 on the joint unit 47 to guide mounting of the ink cartridges 22, the ink cartridges 22 can be mounted on the joint unit 47 along the guides 54 to determine the position easily, even as the pawls 56 engages with the engaging holes 68 and the joint unit 47 attaches flexibly to the base plate 46. Therefore, the supply units 66 of the ink cartridges 22 can be reliably connected to the protrusions 55. With this simple configuration, the joint unit 47 can be detachably mounted on the base plate 46 and the ink cartridges 22 can be satisfactorily mounted on the joint unit 47.

Providing this type of head unit 25 in the color ink jet printer 21 prevents clogging of the nozzles 75 and ensures that the actuator 70 and the manifold 71 are reliably positioned, enabling a good printing quality.

Next, a method to connect the flexible wiring board 49 to the relay circuit plate unit 93 will be described.

Figure 35:
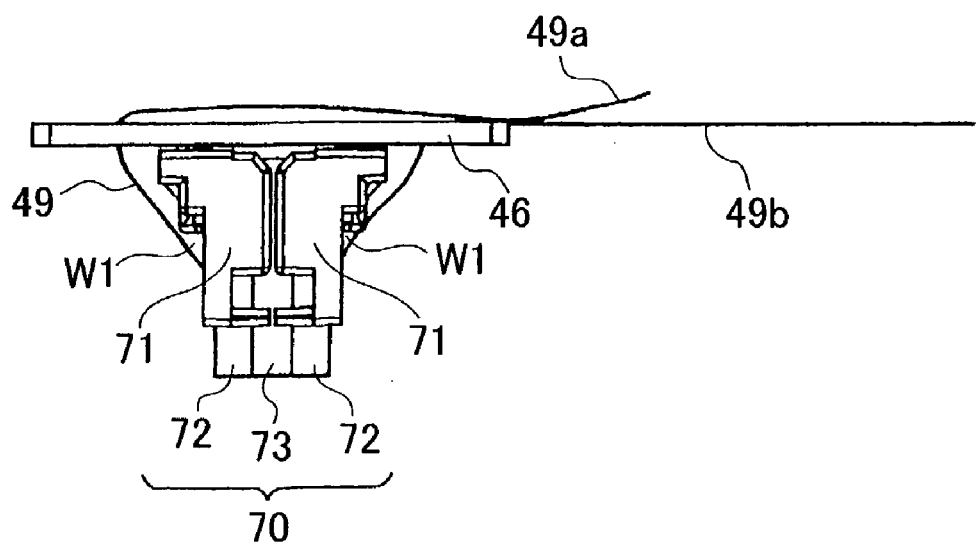
FIG. 35 is a front view showing of the manifold and the actuator mounted on the base plate.

As shown in FIGS. 3, 7, and 35 the flexible wiring board 49 includes an outer flexible wiring board 49a and an inner flexible wiring board 49b. The inner flexible wiring board 49a is for one of the rows of ejection channels 74 nearer to relay circuit plate unit 93, i.e., one of the two rows that is on the outer side of the carriage 26. The outer flexible wiring board 49a extends through one of the depression 69 in the base plate 46 to relay circuit plate unit 93. On the other hand, the outer flexible wiring board 49b is for the other one of the rows of ejection channels 74 far from relay circuit plate unit 93, i.e., the one that is on the inner side of the carriage 26. The inner flexible wiring board 49b is wrapped from other one of the depressions 69 and extends over the top surface of the base plate 46. As shown in FIG. 15, the inner flexible wiring board 49b is sandwiched between the top surface of the base plate 46 and the bottom surface of the lower joint 53 along the widthwise direction of the base plate 46 and is subsequently pulled toward the same side as the external flexible wiring board 49a. As shown in FIG. 3, the inner flexible wiring board 49b is wrapped around toward relay circuit plate unit 93, parallel to the external flexible wiring board 49a.

By arranging the flexible wiring board 49 in this way, the external flexible wiring board 49a and the inner flexible wiring board 49b connected to each row of the ejection channels 74 can be drawn together toward one side of the ink jet head 24 and connected to the relay circuit plate unit 93.

Each flexible wiring board 49 is pulled outward in relation to the center of the carriage 26 as shown in FIG. 3, and connected via the corresponding plate unit 93 to the two flexible wiring boards 50 that are disposed along each side wall of the carriage 26. In this way, each flexible wiring board 49 connected to two neighboring inkjet head 24 are pulled to the outer sides of these two inkjet heads 24 and are connected to the flexible wiring boards 50 on each side of the carriage 26. Hence, a construction having left and right symmetry can be achieved between two neighboring ink jet heads 24, thereby being centered around the central axis of the carriage 26. In this type of color ink jet printer 21, common parts are used for the flexible wiring board 49, relay circuit plate unit 93, the flexible wiring boards 50, and other wiring parts, thereby improving production efficiency and lowering costs.

Further, with this construction, it is not necessary to provide additional space or members for guiding the wrapping operation that are necessary when winding the inner flexible wiring board 49b in the center of the carriage 26, and a cover member or the like for protecting the inner flexible wiring board 49b when mounting the ink cartridges 22. Therefore, this type of flexible wiring board 49 reduces the number of parts and the cost of manufacturing and enables the devices to be made more compact.

Next, the relay circuit plate unit 93 will be described in detail. The relay circuit plate unit 93 includes a rigid COB 93A, an IC chip 95, a radiator 96, and a cover member 102. The cover member 102 supports both the COB 93A and the radiator 96.

The COB 93A is formed in a roughly rectangular shape. The external flexible wiring board 49a is connected to a top edge of the COB 93A, and the inner flexible wiring board 49b is connected to the bottom edge. The IC chip 95 and the radiator 96 also have an approximate rectangular shape, and are mounted on the front and rear surfaces of the COB 93A, respectively. The IC chip 95 is for selectively driving the plurality of ejection channels 74. The radiator 96 is for radiating the heat from the IC chip 95.

Figure 26:
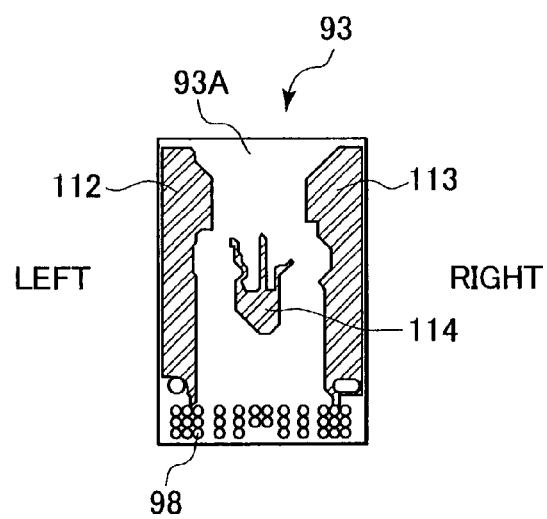
FIG. 26 is a plan view showing a relay circuit plate unit.

As shown in FIG. 26, the OCB 93A is formed of a glass epoxy resin in a substantially rectangular shape. The front surface of the COB 93A is provided with a GND land 112, a GND land 113, and a GND land 114, which are ground printed patterns. The GND land 112 is provided near the left edge of the COB 93A and extends along the lengthwise direction of the relay circuit plate unit 93. The GND land 113 is provided near the right edge, and also extends along the lengthwise direction of the relay circuit plate unit 93. The GND land 114 is provided between the GND land 112 and the GND land 113. An insulating film is formed over the GND lands 112, 113, and 114.

Figure 27:
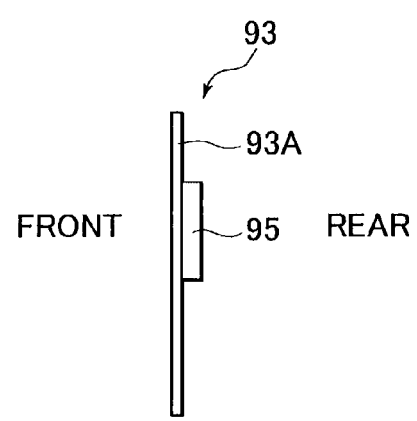
FIG. 27 is a right side view of the relay circuit plate unit.

As shown in FIG. 27, the CI chip 95 is provided on the rear surface of the relay circuit plate unit 93 at a position corresponding to the GND land 114. The plurality of contact points 98 are provided on the bottom end of the relay circuit plate unit 93.

Next, the construction of the radiator 96 will be described with reference to FIGS. 28 and 29.

Figure 28:
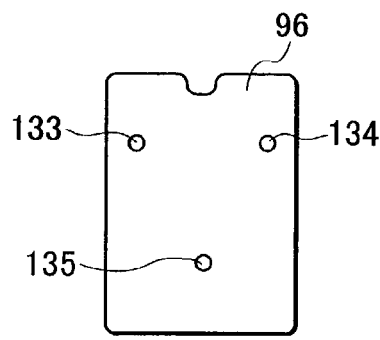
FIG. 28 is a plan view showing a radiator of the relay circuit plate unit.
Figure 29:
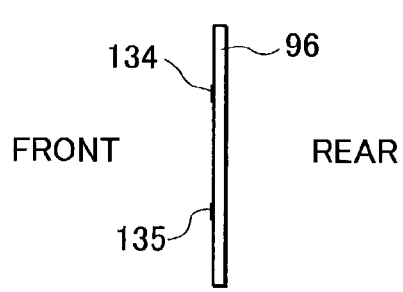
FIG. 29 is a right side view of the radiator.

As shown in FIGS. 28 and 29, the radiator 96 is formed in an approximately rectangular shape by punching an aluminum alloy plate. The punching process is performed from the rear side of the radiator 96, so that burrs 96a (FIG. 33) are formed on the edges of the radiator 96 to protrude from the front surface of the radiator 96 during the punching process. The radiator 96 is formed with cylindrical protrusions 133, 134, and 135 on its front surface near the top left, the top right, and the bottom center, respectively. Each of the protrusions 133, 134, and 135 protrudes in the same direction as the burrs 96a. The height of the protrusions 133, 134, 135 is preset higher than the burrs 96a by a prescribed amount, which can be set arbitrarily. To determine the height of the protrusions 133, 134, and 135, an aluminum alloy plate material used for the radiator 96 is pressed in advance to measure the height of the burrs formed on the edges.

Next, the operation for fixing the radiator 96 to the COB 93A will be described with reference to FIGS. 30 to 33.

Figure 30:
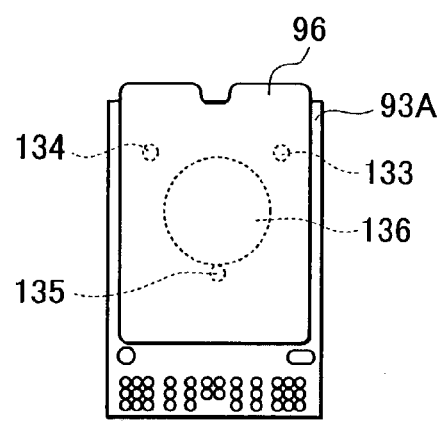
FIG. 30 is a plan view showing the radiator fixed to a COB.
Figure 31:
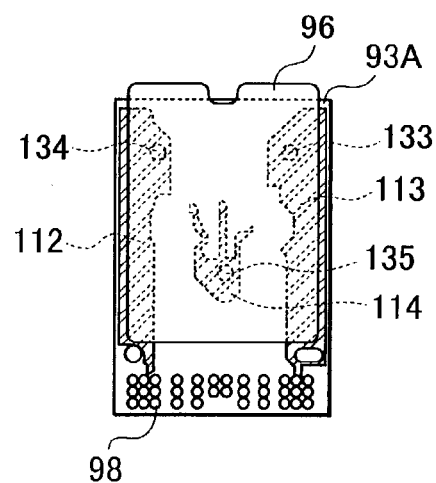
FIG. 31 is a plan view in partial phantom showing the radiator fixed to a COB.
Figure 32:
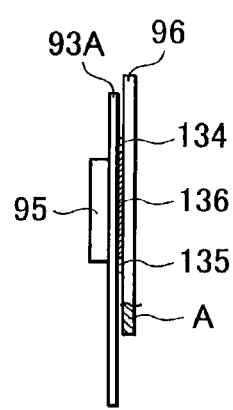
FIG. 32 is a left side view of the relay circuit plate unit.

As shown in FIG. 30, an adhesive 136 having a high thermal conductivity is applied in an approximate circular shape in the center of front surface of the radiator 96. Next, the radiator 96 is placed on front surface of the COB 93A by using a jig (not shown) for positioning such that the protrusions 133, 134, 135 protrude toward the COB 93A. At this time, the protrusions 133, 134, 135 oppose the GND land 113, 112, 114, respectively, as shown in FIG. 31. In this way, the radiator 96 is fixed to the COB 93A.

Figure 33:
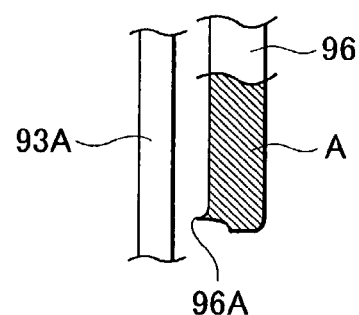
FIG. 33 is an enlarged partial view of an area A indicated in FIG. 32.

In this arrangement, as shown in FIG. 33, the burrs 96a also protrude toward the COB 93A. However, because the protrusions 133, 134, and 135 are higher than the burrs 96a, a fixed interval is maintained between the burrs 96a and the COB 93A while preventing the burrs 96a from scratching front surface of the COB 93A and also from causing breakage or shorts in the integrated circuit board. By facing toward the COB 93A, the burrs 96a does not scratch the flexible wiring boards 49 either.

Also, even if the protrusions 133, 134, and 135 scratch the insulating film on the COB 93A, they will not cause shorts or the like since the protrusions 133, 134, and 135 contact the grounded GND lands 113, 112, and 114, respectively. Since the GND lands 112, 113 and 114 have a relatively large surface area, wire breakage or the like is not caused.

Moreover, in the above arrangement, the adhesive 136 applied on the center of the radiator 96 positions on the front surface of the radiator 96 across from the CI chip 95 provided on the rear surface of the radiator 96, heat generated from the CI chip 95 is conducted to the radiator 96 via the adhesive 136 and dissipated.

Because the adhesive 136 is not applied over the entire front surface of the radiator 96, but is applied in a circular-like shape in the center of the radiator 96, using only a sufficient amount to provide thermal conductivity based on the size of the CI chip 95. Accordingly, portions of the radiator 96 and the COB 93A not fixed by the adhesive 136 are not restrained but can expand independently of each other. This configuration prevents the COB 93A from warping due to differences in the linear expansion coefficient of the radiator 96 and the COB 93A when the temperature is raised by heat emitted from the CI chip 95.

Figure 34:
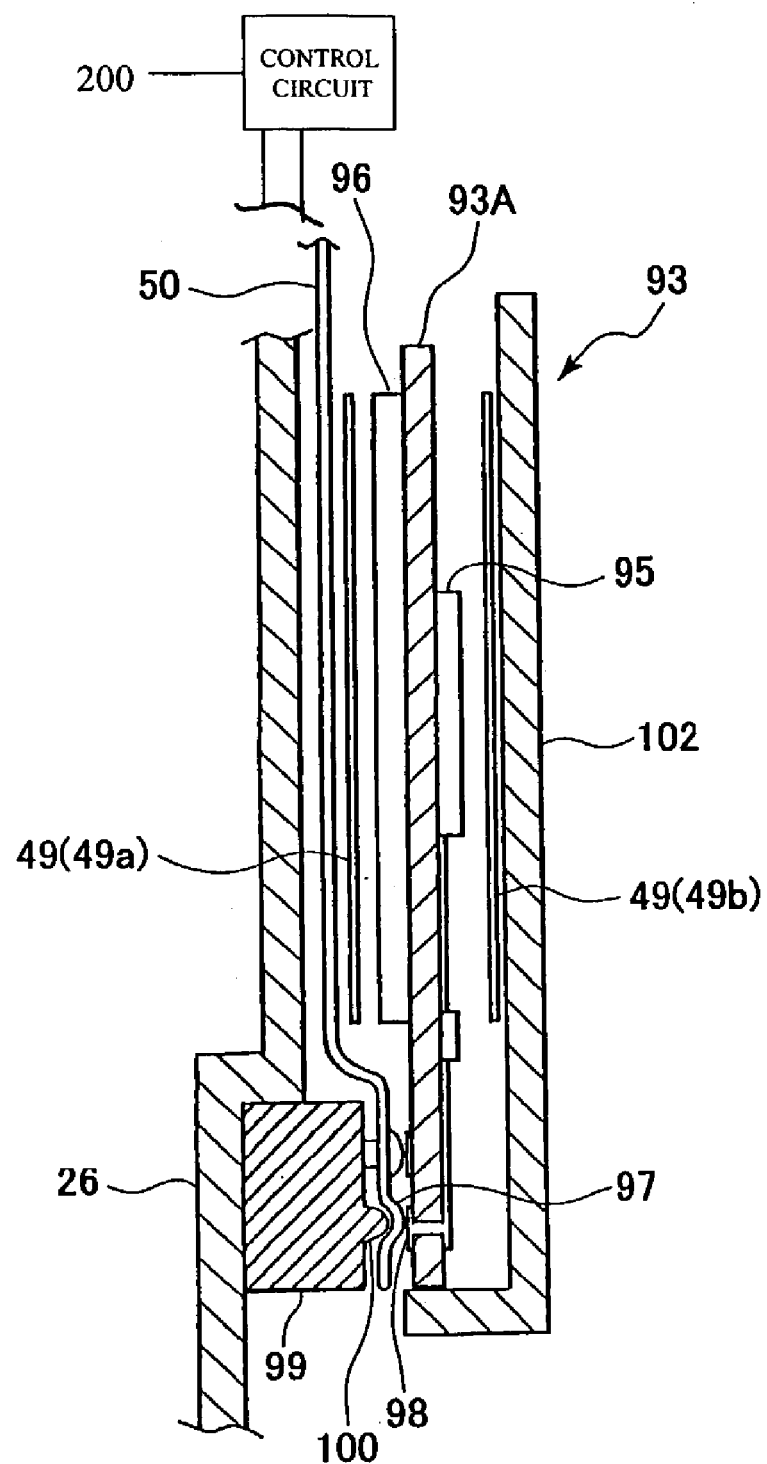
FIG. 34 is an enlarged partial side view of the relay circuit plate unit.

As shown in FIG. 34, the contact points 98 of the relay circuit plate unit 93 are connected to contact points 97 of the flexible wiring boards 50. One end of each contact point 98 is extended to connect to the IC chip 95 one the rear surface of the COB 93A, and the other end penetrates through an edge of the COB 93A in the thickness direction and is exposed on the front surface of the same. The cover member 102 is formed of an insulating material and attached to the COB 93A. A top ridge 103 and a bottom ridge 104 are formed in the lengthwise direction across the top edge and bottom edge respectively of the cover member 102. Through pressure applied by a clamping member 101 described later, the cover member 102 is configured to cover both the surface of the COB 93A and the IC chip 95.

As shown in FIGS. 5 and 7, the ink cartridges 22 is further formed with a pad member 99 and a clamping member 101 for supporting the flexible wiring boards 50 and the relay circuit plate unit 93. The pad member 99 is formed of an elastic member, such as rubber, and has an approximately rectangular shape. The pad member 99 is provided between the free end of the flexible wiring boards 50 and the sidewall of the carriage 26. The pad member 99 is formed with a plurality of protrusions 100 on its surface, and supports the free end of the flexible wiring boards 50 while the plurality of contact points 97 overlapping the top of the protrusions 100.

The clamping member 101 is provided on both walls of the carriage 26. The clamping member 101 applies pressure to connect the contact points 97 of the flexible wiring boards 50 to the contact points 98 of the COB 93A.

As shown in FIGS. 3 and 5, the clamping member 101 is provided with an upper clamping member 105 and a lower clamping member 106. The upper clamping member 105 is pivotally supported on top of the side wall of the carriage 26 and rotates up and down. When rotated downward, the upper clamping member 105 opposes the front side of the pad member 99 as indicated by the dotted lines in FIG. 5. The bottom surface of the upper clamping member 105A is formed with a clamping groove 107 extending along the lengthwise direction. A spring member 108 is disposed on the inside of the clamping groove 107 for applying contact pressure to the top ridge 103 of the cover member 102.

The lower clamping member 106 is provided on the bottom of the side wall on the carriage 26 opposing the upper clamping member 105 with the pad member 99 interposed between the upper clamping member 105 and the lower clamping member 106. The top surface of the lower clamping member 106 is formed a protruding ridge 109 for receiving the cover member 102 and engaging with the bottom ridge 104.

When the bottom ridge 104 engages with the protruding ridge 109 as shown in FIGS. 3 and 34, the contact points 98 of the COB 93A correspond in position to the contact points 97 of the flexible wiring boards 50. When the upper clamping member 105 is rotated downward in this condition, the clamping groove 107 grips the side wall of the carriage 26, the pad member 99, and the cover member 102. As a result, the urging force of the spring member 108 contacts the contact points 97 of the flexible wiring boards 50 to the contact points 98 of the COB 93A.

With this configuration, control signals are transmitted from the control circuit 200 of the main unit of the device 21 via the flexible wiring boards 50 to the IC chip 95, and the IC chip 95 outputs the control signals as ejection pulse signals for selectively driving each ejection channel 74 via the flexible wiring board 49 to each channel member 72. Because one end of the external flexible wiring board 49a and the inner flexible wiring board 49b is connected to each side of the COB 93A, and because the other end is connected to each row of the ejection channels 74, the ink jet head 24 can reliably drive each row of the ejection channels 74.

Because the contact points 97 and the contact points 98 are connected by the clamping member 101 in this way, a reliable connection can be achieved through pressure. However, the position of the ink jet head 24 is determined when mounted on the carriage 26 by the engaging member 43a, engaging member 43b, and plate springs 45a and 45b provided independent from the clamping member 101 in the carriage 26. Accordingly, pressure from the clamping member 101 has no effect on determining the position of the ink jet head 24. Hence, the ink jet head 24 is not moved out of position by such pressure, enabling the printer to maintain accurate and reliable positioning to achieve high quality printing.

As described above, the relay circuit plate unit 93 is provided on the free end of the flexible wiring board 49, while the IC chip 95 and the contact points 98 of the flexible wiring board 49 are provided on the COB 93A of relay circuit plate unit 93. Therefore, the IC chip 95 can be simply and reliably supported on the COB 93A, while the contact points 98 of the flexible wiring board 49 are reliably connected through a simple construction to the contact points 97 of the flexible wiring boards 50.

While some exemplary embodiments of this invention have been described in detail, those skilled in the art will recognize that there are many possible modifications and variations which may be made in these exemplary embodiments while yet retaining many of the novel features and advantages of the invention.

In the above description, the ink jet head 24 was used as an example of the recording head. However, the recording head of the present invention is not limited to an ink jet head, but also includes a dot impact head, a thermal head, and other recording heads well known in the art.

In the above description, the pawls 56 are formed on the joint unit 47 with the engaging holes 68 formed on the base plate 46e. However, the opposite is also possible, that is, forming the engaging holes 68 on the joint unit 47 and the pawls 56 on the base plate 46. Further, while the protrusions 86 are formed on the joint unit 47 in the above description, the protrusions 86 can be instead formed on the base plate 46.

In the color ink jet printer 21 described above, the ink cartridges 22 are mounted in the carriage 26 via the joint unit 47. However, the ink cartridges 22 do not need to be mounted in the carriage 26. For example, the ink tank can be disposed at a fixed position outside the carriage 26, while ink is supplied from the ink tank to the protrusions 55 of the joint unit 47 via a flexible tube.

Further, the manifold 71 and the channel members 72 can also be configured as one unit instead. The liquid substance being supplied is not limited to ink, but can be another type of liquid. While protrusions are formed on the manifold 71 in the embodiment described above, protrusions could be formed on the center plate 73 instead.

Although the relay circuit plate unit 93 is used in the example of the preceding embodiments, it is obvious that the present invention can be applied to various circuit boards using a radiator. It is also obvious that the present invention is not limited to an ink jet printer, but can be applied to circuit boards of various apparatus. The number of protrusions on the radiator 96 can be set to any arbitrary value and is not necessarily limited to three. The protrusion is also not limited to a cylindrical shape, but can be formed in other shapes, such as a quadratic prism.

The channel members 72 are mounted on both surfaces of the center plate 73 in the embodiment described above, but it is also possible to mount one channel member 72 on only one surface of the center plate 73.

Moreover, in the above embodiment the space 71d is defined between the center plate 73 and the manifold 71 of the ink jet head 24, this is not a limitation of the preset invention. That is, the present invention can be applied to any component that includes a first element formed with a channel and a second element attached to the first element, so as to fix the first element and the second element in the above-described preferable manner by sealing agent applied into a space defined between the first element and the second element.

What is claimed is:

1. An ink jet head unit comprising:
   a base plate;
   an actuator formed with a plurality of ink channels each having an inlet port and fixed to the base plate;
   a manifold that is attached to the actuator for supplying an ink to the plurality of ink channels through the inlet ports;
   a joint unit detachably mounted to the base plate, the joint unit being formed with an ink-supply channel through which an ink from an external ink supply member is introduced into the manifold; and
   a filter provided at the ink-supply channel of the joint unit.

2. The ink jet head unit according to claim 1, wherein one of the joint unit and the base plate is formed with a pawl, and another one of the joint unit and the base plate is formed with an engagement portion that engages the pawl.

3. The ink jet head unit according to claim 1, further comprising an ink-supply pipe formed from an elastic material, wherein the joint unit is attached to one side of the base plate and the manifold and the actuator are attached to another side of the base plate opposite from the one side, and the ink-supplying pipe is provided between the joint unit and the manifold through the base plate for supplying the ink from the joint unit to the manifold.

4. The ink jet head unit according to claim 1, wherein the joint unit is formed with a guide portion that guides attachment of the external ink supply member, and the external ink supply member is a cartridge.

5. The ink jet head unit according to claim 1, wherein the filter includes a first filter having pores that provide surface tension of ink for preventing ink leakage and a second filter having a filtration precision that is greater than a filtration precision of the first filter, and the ink-supply channel has an inlet port through which ink is introduced from the external ink supply member and an outlet port through which the ink is supplied to the manifold, and the first filter is provided at the inlet port of the ink-supply channel, and the second filter is provided at the outlet port.

6. The ink jet head unit according to claim 5, wherein the second filter has a filtering surface that is greater than a filtration surface of the first filter.

7. The ink jet head unit according to claim 5, wherein the first filter has the filtration precision of 20 μm to 300 μm.

8. The ink jet head unit according to claim 7, wherein the second filter has the filtration precision of less than 20 μm.

9. The ink jet head unit according to claim 5, wherein the second filter has the filtration precision of less than 20 μm.

10. The ink jet head unit according to claim 1, wherein the filter includes a first filter and a second filter, and the joint unit includes a first member and a second member fixed to the first member along a contact phase, the ink-supply channel is defined between the first member and the second member and extends along the contact phase, the ink-supply channel having an inlet port through which ink is introduced from the external ink supply member, and the first filter is provided at the inlet port, and the second filter is provided at the outlet port, the first filter having a surface in parallel with the contact phase.

11. The ink jet head unit according to claim 1, wherein the joint unit includes a first member and a second member fixed to the first member by ultrasonic welding, the first member and the second member defining the ink-supply channel therebetween, the first member being formed with a first portion that supports a periphery of the filter and a second portion that contacts a substantial center of the filter.

12. The ink jet head unit according to claim 11, wherein the ink passes through the filter from upstream to downstream, and the second portion contacts the filter from the downstream side of the filter, and the second member is formed with a third portion that contacts the substantial center of the filter from the upstream side of the filter.

13. The ink jet head unit according to claim 11, wherein the ink passes through the filter from upstream to downstream, and the second portion contacts the filter from the downstream side of the filter, and the ink-supply channel has an outlet port positioned off-center with respect to a surface of the filter.

14. The ink jet head unit according to claim 11, wherein the first member and the second member define a contact phase along which the first member and the second member are fixed to each other, and the ink-supply channel has an outlet port formed to the first member and extends along the contact phase, and the filter is positioned parallel to the contact phase, and the outlet port is formed in confrontation with the surface of the filter.

15. The ink jet head unit according to claim 11, wherein the filter is fixed to the first portion and the second portion of the first member before the first member and the second member are fixed to each other by ultrasonic welding.

16. The ink jet head unit according to claim 11, wherein the actuator is connected to the outlet port such that ink is introduced from the ink-supply channel to the actuator via the outlet port.

17. The ink jet head unit according to claim 11, wherein the joint unit includes a first member and a second member fixed to the first member by ultrasonic welding, the first member and the second member defining the ink-supply channel therebetween, the first member being formed with supports that support the filter, the filter having a filtration surface positioned between the supports, and the ink-supply channel has an outlet port located off-center with respect to the filtration surface between the supports.

18. An ink jet recording device comprising:
a base plate;
an actuator formed with a plurality of ink channels each having an inlet port and fixed to the base plate;
a manifold that is attached to the actuator for supplying an ink to the plurality of ink channels through the inlet ports;
a joint unit detachably mounted to the base plate, the joint unit being formed with an ink-supply channel through which an ink from an external ink supply member is introduced into the manifold; and
a filter provide at the ink-supply channel of the joint unit.

19. An ink jet recording device comprising;
an ink jet head including:
an actuator including a channel member having a first surface being formed with a plurality of grooves each extending in a first direction and a cover member having a first surface attached to the first surface of the ejection channel member, thereby defining a plurality of ejection channels between the cover member and the channel member, each of the ejection channels having an inlet port, wherein the cover member has a height in the first direction that is greater than a height of the channel member such that the cover member has a protruding portion that is protruding in the first direction from the channel member; and
a channel defining member including a manifold for supplying an ink to the plurality of ejection channels through the inlet ports; and
a base plate that supports the ink jet head, the base plate being in confrontation with the protruding portion of the cover member with a first space formed therebetween, wherein;
the manifold is positioned between the base plate and the channel member at a side of the protruding portion of the cover member with a second space formed between the manifold and the base plate, the second space being smaller than the first space, the manifold being attached to the channel member and the side of the protruding portion of the cover member; and
both the first and the second spaces are filled with an adhesive, thereby attaching the base plate to both the cover member and the manifold.

20. The ink jet recording device according to claim 19, wherein the channel member and the manifold are provided to each of two sides of the protruding portion of the cover member.

21. The ink jet recording device according to claim 19, wherein the cover member and the manifold together define an ink channel and also define an attachment portion between the cover member and the manifold, the attachment portion having an attachment phase, and the manifold is formed with a first protrusion defining a third space between the first protrusion and the cover member to which an adhesive is applied, the third space extending along the attachment portion and at least a portion of external of the ink channel, the third space having an opening at one end and a port at another end separated from the one end, the port exposing the third space to an ambient air.

22. The ink jet recording device according to claim 21, wherein the first protrusion has a tip end that defines the port between the tip end and the cover member.

23. The ink jet recording device according to claim 21, wherein the cover member has a second surface perpendicular to the attachment phase, and the first protrusion is formed with a regulation portion in abutment with the second surface of the cover member for regulating a relative position of the manifold and the cover member.

24. The ink jet recording device according to claim 21, wherein the ink is introduced into the ejection channels through the ink channel.

25. The ink jet recording device according to claim 24, wherein the plurality of ejection channels are aligned in a second direction perpendicular to the first direction, and the first protrusion protrudes outward of the manifold with respect to the second direction, and the manifold is further formed with a second protrusion protruding away from the cover member, thereby defining a fourth space between the second protrusion and the cover member, the fourth space having side ends each in fluid communication with the corresponding third space.

26. The ink jet recording device according to claim 24, wherein the cover member has a second surface, and the first protrusion has a member in confrontation with the second surface without contacting the second surface, the member defining the port between the member and the second surface.

27. The ink jet recording device according to claim 21, wherein the third space has a larger cross section toward the one end.

28. The ink jet recording device according to claim 21, wherein the port is opened in a direction perpendicular to a longitudinal direction of the first space.

29. The ink jet recording device according to claim 19, wherein the cover member has a linear expansion coefficient different from a linear expansion coefficient of the manifold, and the cover member and the manifold together define an ink channel and also define a sealing space between the cover member and the manifold, and a first sealing agent having elasticity is applied to the sealing space, and a second sealing agent having a lower air permeability than the first agent is applied on the first sealing agent such that the first sealing agent is positioned between the ink channel and the second sealing agent.

30. The ink jet recording device according to claim 19, wherein the cover member and the manifold together define an ink channel and also define a first sealing space between the cover member and the manifold, and a first sealing agent that is resistant to ink is applied to the sealing space, and a second sealing agent having a lower air permeability than the first agent is applied on the first sealing agent such that the first sealing agent is positioned between the ink channel and the second sealing agent.

31. The ink jet recording device according to claim 30, wherein the cover member has a linear expansion coefficient different from a linear expansion coefficient of the manifold, and the first sealing agent is elastic.

32. The ink jet recording device according to claim 30, wherein the second sealing agent is applied to a position above the ink channel.

33. The ink jet recording device according to claim 30, wherein the manifold is provided with a protrusion that defines a second sealing space between the protrusion and the cover member, the second sealing space being defined at a position away from a periphery of the ink channel, and a third sealing agent is applied into the second space for temporarily fixing the manifold and the cover member.

34. The ink jet recording device according to claim 30, wherein the cover member and the channel defining member are fixed to the base plate by the second sealing agent, and the second sealing agent is a UV curing adhesive.

35. An ink jet head assembly comprising:
  an actuator formed with a plurality of nozzles through which ink droplets are ejected in an ejection direction and formed with a plurality of ejection channels through which ink is supplied to the plurality of nozzles, each ejection channel extending in the ejection direction;
  a channel defining member that supplies the ink to the plurality of ejection channels; and
  a base plate that supports the actuator at a predetermined position, wherein
  the actuator is directly attached to the base plate, and the channel defining member is attached to both the base plate and the actuator.

36. The ink jet head assembly according to claim 35, wherein the actuator has a first attachment portion, and the base plate has a second attachment portion that is attached to the first attachment portion of the actuator, wherein a linear expansion coefficient of the first attachment portion is substantially equal to a linear expansion coefficient of the second attachment portion.

37. The ink jet head assembly according to claim 35, wherein the actuator includes a channel member having a surface formed with a plurality of grooves extending in a first direction and a cover member attached to the surface of the channel member, thereby defining the plurality of ejection channels therebetween, each of the plurality of ejection channels having an inlet port through which the ink is supplied from the channel defining member;
  the cover member has a height in the first direction that is greater than a height of the channel member such that the cover member has a protruding portion protruding in the first direction from the channel member, the protruding portion being attached to the base plate; and
  the channel defining member being formed with a manifold that distributes the ink to the ejection channels through the inlet ports, the manifold being positioned between the channel member and the base plate at a side of the protruding portion of the cover member.

38. The ink jet head assembly according to claim 37, further comprising a supply pipe, wherein;
  the channel defining member further includes a joint unit that receives an external ink cartridge, the join unit being attached to a side of the base plate opposite to the actuator and the manifold; and
  the supply pipe is provided between the joint unit and the manifold though the base plate and supplies the ink from the joint unit to the manifold.

39. The ink jet head assembly according to claim 38, wherein the supply pipe is formed of an elastic material.

40. The ink jet head assembly according to claim 38, wherein the joint unit is elastically attached to the base plate.

41. The ink jet head assembly according to claim 38, wherein one of the joint unit and the base plate is formed with a plurality of protrusions with predetermined intervals, the plurality of protrusions abutting another one of the joint unit and the base plate.

42. The ink jet head assembly according to claim 35, wherein the actuator is attached to the base plate at a longitudinal center portion of the actuator.

* * * * *